(12) United States Patent
Sun et al.

(10) Patent No.: US 10,708,728 B2
(45) Date of Patent: Jul. 7, 2020

(54) ADAPTIVE MODULATION ORDER FOR MULTI-USER SUPERPOSITION TRANSMISSIONS WITH NON-ALIGNED RESOURCES

(71) Applicant: QUALCOMM Incorporated, San Diego, CA (US)

(72) Inventors: Jing Sun, San Diego, CA (US); Wanshi Chen, San Diego, CA (US); Peter Gaal, San Diego, CA (US); Juan Montojo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 176 days.

(21) Appl. No.: 15/601,845

(22) Filed: May 22, 2017

(65) Prior Publication Data

US 2018/0091959 A1    Mar. 29, 2018

Related U.S. Application Data

(60) Provisional application No. 62/398,839, filed on Sep. 23, 2016.

(51) Int. Cl.
*H04W 4/18* (2009.01)
*H04W 52/26* (2009.01)
(Continued)

(52) U.S. Cl.
CPC .............. *H04W 4/18* (2013.01); *H03K 7/10* (2013.01); *H04B 7/0413* (2013.01);
(Continued)

(58) Field of Classification Search
CPC .......................... H04L 1/0009; H04L 5/0044
See application file for complete search history.

(56) References Cited

U.S. PATENT DOCUMENTS 8,374,101 B2    2/2013  Li et al.
8,750,204 B2 *  6/2014  Lee ..................... H04L 1/0026
                                                        370/328
(Continued)

OTHER PUBLICATIONS

Lee H., et al., "Multiuser Superposition Transmission (MUST) for LTE-A Systems", IEEE ICC, Mobile and Wireless Networking Symposium, 2016, pp. 1-6.
(Continued)

*Primary Examiner* — Edan Orgad
*Assistant Examiner* — Nourali Mansoury
(74) *Attorney, Agent, or Firm* — Holland & Hart LLP

(57) ABSTRACT

Multi-user superposition transmissions (MUSTs) on non-aligned resources are described. A base station may schedule a transmission to an enhancement layer user equipment (UE) and a base layer UE. The transmission may include a base layer that spans a base layer resource set and an enhancement layer that spans an enhancement layer resource set, where the resource sets may be aligned or un-aligned. The base station may use a combined constellation to map symbols to the base layer resource set for communication with the enhancement layer and base layer UEs over overlapping portions of the resource sets, and an extended constellation to map symbols to an extended set of resources for which the enhancement layer resource set is exclusive of the base layer resource set. The extended constellation may be based on an extended modulation order determined based on a base modulation order and an enhancement modulation order.

30 Claims, 18 Drawing Sheets

(51) Int. Cl.

| | | |
|---|---|---|
| *H04W 52/14* | (2009.01) | |
| *H04W 72/06* | (2009.01) | |
| *H04W 88/04* | (2009.01) | |
| *H04W 72/12* | (2009.01) | |
| *H04L 27/34* | (2006.01) | |
| *H03K 7/10* | (2006.01) | |
| *H04B 7/0413* | (2017.01) | |
| *H04L 5/00* | (2006.01) | |
| *H04L 1/00* | (2006.01) | |

(52) U.S. Cl.
CPC .......... *H04L 1/0009* (2013.01); *H04L 5/0044* (2013.01); *H04L 27/34* (2013.01); *H04L 27/3416* (2013.01); *H04W 52/143* (2013.01); *H04W 52/262* (2013.01); *H04W 72/06* (2013.01); *H04W 72/12* (2013.01); *H04W 88/04* (2013.01)

(56) References Cited

U.S. PATENT DOCUMENTS

| | | | | |
|---|---|---|---|---|
| 2006/0171283 | A1* | 8/2006 | Vijayan | H04L 1/0045 369/94 |
| 2008/0219236 | A1* | 9/2008 | Love | H04L 5/0007 370/347 |
| 2010/0311343 | A1* | 12/2010 | Keerthi | H04L 5/0023 455/63.1 |
| 2011/0170575 | A1* | 7/2011 | Harrison | H04B 7/0678 375/146 |
| 2012/0230432 | A1* | 9/2012 | Boyce | H04N 21/234327 375/240.25 |
| 2013/0039334 | A1* | 2/2013 | Han | H04L 5/0007 370/330 |
| 2014/0019830 | A1* | 1/2014 | Chen | H04L 1/004 714/776 |
| 2014/0313985 | A1* | 10/2014 | Nimbalker | H04L 27/0012 370/329 |
| 2015/0139120 | A1* | 5/2015 | Elarabawy | H04L 5/0057 370/329 |
| 2015/0326360 | A1* | 11/2015 | Malladi | H04L 5/0032 370/329 |
| 2016/0191175 | A1* | 6/2016 | Hwang | H04L 1/1822 370/329 |
| 2016/0212458 | A1* | 7/2016 | Kwon | H04N 21/234327 |
| 2017/0019207 | A1 | 1/2017 | Park et al. | |

OTHER PUBLICATIONS

QUALCOMM: "Multiuser Superposition Schemes", 3GPP TSG-RAN WG1 #83, R1-157075, Nov. 16-20, 2015, pp. 1-7.

ZTE: "Potential Transmission Schemes for MUST", 3GPP TSG RAN WG1 Meeting #82, R1-154055, Aug. 24-28, 2015, pp. 1-4.

3GPP, "3rd Generation Partnership Project; Technical Specification Group Radio Access Network; Evolved Universal Terrestrial Radio Access (E-UTRA); Multiplexing and Channel Coding (Release 13)", 3GPP Technical Specification, Jun. 2016, 140 pgs., 3GPP TS 36.212, V13.2.0, XP051123279, 3rd Generation Partnership Project, Valbonne, France.

3GPP, "3rd Generation Partnership Project; Technical Specification Group Radio Access Network; Evolved Universal Terrestrial Radio Access (E-UTRA); Physical Layer Procedures (Release 12)," 3GPP Technical Specification, Jun. 2016, 241 pgs., 3GPP TS 36.213, V12.10,0, XP051123240, 3rd Generation Partnership Project, Valbonne, France.

ISA/EP, International Search Report and Written Opinion of the International Searching Authority, Int'l Application No. PCT/US2017/048738, dated Nov. 29, 2017, European Patent Office, Rijswijk, NL, 18 pgs.

NTT Docomo, "Discussion on Remaining Issues and Signaling Design for DL MUST," 3GPP TSG RAN WG1 Meeting #86, R1-167364, Gothenburg, Sweden, Aug. 22-26, 2016, 3 pgs., XP051125869, 3rd Generation Partnership Project.

NTT Docomo, "Views on Network Assistance Signaling for DL MUST," 3GPP TSG RAN WG1 Meeting #84bis, R1-163170, Busan, Korea, Apr. 11-15, 2016, 5 pgs., XP051080573, 3rd Generation Partnership Project.

* cited by examiner

ADAPTIVE MODULATION ORDER FOR MULTI-USER SUPERPOSITION TRANSMISSIONS WITH NON-ALIGNED RESOURCES

CROSS REFERENCES

The present application for patent claims priority to U.S. Provisional Patent Application No. 62/398,839 by SUN, et al., entitled "ADAPTIVE MODULATION ORDER FOR MULTI-USER SUPERPOSITION TRANSMISSIONS WITH NON-ALIGNED RESOURCES," filed Sep. 23, 2016, assigned to the assignee hereof, and expressly incorporated by reference herein.

BACKGROUND

The following relates generally to wireless communication and more specifically to adaptive modulation orders for multi-user superposition transmissions (MUSTs) with non-aligned resources.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system). A wireless multiple-access communications system may include a number of base stations, each simultaneously supporting communication for multiple communication devices, which may be otherwise known as user equipment (UE).

CDMA, TDMA, FDMA, and OFDMA systems may communicate with multiple UEs through the use of resource sharing and/or orthogonal transmissions. In some cases, separate communications to multiple UEs may be accomplished by strategically sharing resources or by orthogonally transmitting to the UEs over simultaneously-shared ("common") resources. For instance, a TDMA system may designate time intervals for transmissions during which a UE is scheduled to receive a transmission over a common frequency channel—e.g., the base station may transmit to a first UE in a first time interval, a second UE in a second time interval, etc. An FDMA system may simultaneously communicate with multiple UEs by sending UE-specific transmissions over separate frequency resources allocated to each of the UEs.

CDMA systems may simultaneously transmit to each of the UEs using the same time and frequency resources, but may uniquely modulate transmissions to different UEs with an orthogonal code. The UEs may be assigned unique orthogonal codes, and may apply the orthogonal codes to received signals to identify the transmission intended for that UE. OFDMA utilizes a combination of TDMA and FDMA techniques applied over orthogonal subcarriers. In some cases, multiple-input multiple-output (MIMO) techniques may be employed, which take advantage of spatial properties of channels to the UEs to separate data streams sent over different spatial resources. For example, MIMO techniques include modulating transmission streams with space-time orthogonal codes, such as spatial frequency block codes (SFBC). These spatial resources may be called spatial layers, and the same or different streams of data may be transmitted over different spatial layers. For single-user MIMO (SU-MIMO), multiple spatial layers are transmitted to the same UE, while in multiple user MIMO (MU-MIMO), multiple spatial layers are transmitted to different UEs.

A wireless communications system may utilize MUST techniques to support communications with multiple UEs that share time and frequency resources without using orthogonal transmissions. For example, a MUST transmission may include multiple streams of data intended for multiple UEs using common resources—e.g., at least partially overlapping time, frequency, and/or spatial resources—but may transmit the streams of data without uniquely orthogonalizing the transmissions to the different UEs. MUST transmissions may take advantage of the physical locations of the UEs in the wireless communications system to transmit multiple streams of data intended for multiple UEs. The different streams of data may be transmitted over different non-orthogonal transmission layers. In some cases, the base station may transmit an enhancement layer to a first UE that has relatively higher geometry (e.g., higher signal-to-noise ratio (SNR), closer to the base station) and a base layer to a second UE that has a relatively weaker geometry (e.g., lower SNR, farther from the base station) using overlapping resources. MUST may also be referred to as non-orthogonal multiple access (NOMA).

The MUST transmission layers may be multiplexed in various ways including by using different transmit power levels, hierarchical modulation, or other multiplexing techniques. Hierarchical modulation may describe a scenario in which a base modulation order of a base layer and an enhancement modulation order of an enhancement layer are combined into a joint symbol constellation. In some cases, the resources occupied by a base layer in a transmission may not align with the resources occupied by an enhancement layer in the same transmission. Efficiently using resources for a transmission with unaligned transmission layers presents challenges.

SUMMARY

The described techniques relate to improved methods, systems, devices, or apparatuses for utilizing adaptive modulation orders for multi-user superposition transmissions (MUSTs) with non-aligned resources. A base station may schedule a transmission to an enhancement layer user equipment (UE) and a base layer UE. The transmission may include a base layer that spans a base layer resource set and an enhancement layer that spans an enhancement layer resource set. In some cases, the enhancement layer resource set may be larger than the base layer resource set (e.g., the base layer resource set may be a subset of the enhancement layer resource set). The base station may use a combined constellation to map symbols to the base layer resource set for communication with the enhancement layer UE and the base layer UE, and the base station may use an extended constellation to map symbols to an extended set of resources that includes a portion of the enhancement layer resource set that is exclusive of the base layer resource set. The extended constellation may be based on an extended modulation order determined based on a base modulation order and an enhancement modulation order.

A method for wireless communication is described. The method may include scheduling a transmission including a base layer for a first UE and an enhancement layer for a second UE, where the enhancement layer spans a resource set and the base layer spans a first subset of the resource set, mapping a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order, and transmitting the transmission to the first UE and the second UE.

An apparatus for wireless communication is described. The apparatus may include means for scheduling a transmission including a base layer for a first UE and an enhancement layer for a second UE, where the enhancement layer spans a resource set and the base layer spans a first subset of the resource set, means for mapping a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order, and means for transmitting the transmission to the first UE and the second UE.

Another apparatus for wireless communication is described. The apparatus may include a processor, memory in electronic communication with the processor, and instructions stored in the memory. The instructions may be operable to cause the processor to schedule a transmission including a base layer for a first UE and an enhancement layer for a second UE, where the enhancement layer spans a resource set and the base layer spans a first subset of the resource set, map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order, and transmit the transmission to the first UE and the second UE.

A non-transitory computer readable medium for wireless communication is described. The non-transitory computer-readable medium may include instructions operable to cause a processor to schedule a transmission including a base layer for a first UE and an enhancement layer for a second UE, where the enhancement layer spans a resource set and the base layer spans a first subset of the resource set, map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order, and transmit the transmission to the first UE and the second UE.

Some examples of the method, apparatus, and non-transitory computer-readable medium described above may further include processes, features, means, or instructions for encoding a first transport block to obtain the first portion of the second encoded bit stream and a first subset of the second portion of the second encoded bit stream. Some examples of the method, apparatus, and non-transitory computer-readable medium described above may further include processes, features, means, or instructions for encoding a second transport block to obtain a second subset of the second portion of the second encoded bit stream. Some examples of the method, apparatus, and non-transitory computer-readable medium described above may further include processes, features, means, or instructions for encoding a single transport block to obtain the first and second portions of the second encoded bit stream.

Some examples of the method, apparatus, and non-transitory computer-readable medium described above may further include processes, features, means, or instructions for determining a transport block size for the encoding based on the enhancement modulation order over the resource set and a coding rate associated with the enhancement layer. Some examples of the method, apparatus, and non-transitory computer-readable medium described above may further include processes, features, means, or instructions for sequentially rate-matching the second encoded bit stream to the resource set.

Some examples of the method, apparatus, and non-transitory computer-readable medium described above may further include processes, features, means, or instructions for sequentially rate-matching the second encoded bit stream to the first subset of the resource set and the second subset of the resource set corresponding to the enhancement modulation order and then to the second subset of the resource set corresponding to the base modulation order. Some examples of the method, apparatus, and non-transitory computer-readable medium described above may further include processes, features, means, or instructions for performing a first rate-matching procedure of the second encoded bit stream to the first subset of the resource set and the second subset of the resource set corresponding to the enhancement modulation order. Some examples of the method, apparatus, and non-transitory computer-readable medium described above may further include processes, features, means, or instructions for performing a second rate-matching procedure of the second encoded bit stream to the second subset of the resource set corresponding to the base modulation order.

Some examples of the method, apparatus, and non-transitory computer-readable medium described above may further include processes, features, means, or instructions for determining a transport block size for the encoding based on the enhancement modulation order over the first subset of the resource set, the extended modulation order over the second subset of the resource set, and a coding rate associated with the enhancement layer.

Some examples of the method, apparatus, and non-transitory computer-readable medium described above may further include processes, features, means, or instructions for transmitting a downlink control information (DCI) message that includes an indication of the enhancement modulation order. Some examples of the method, apparatus, and non-transitory computer-readable medium described above may further include processes, features, means, or instructions for determining the extended modulation order based on adding the base modulation order to the enhancement modulation order.

Some examples of the method, apparatus, and non-transitory computer-readable medium described above may further include processes, features, means, or instructions for transmitting a DCI message that includes an indication of the extended modulation order. Some examples of the method, apparatus, and non-transitory computer-readable medium described above may further include processes, features, means, or instructions for determining the enhancement modulation order based on subtracting the base modulation order from the extended modulation order.

In some examples of the method, apparatus, and non-transitory computer-readable medium described above, the resource set includes a plurality of spatial layers, and at least one spatial layer of the plurality of spatial layers includes the base layer. In some examples of the method, apparatus, and non-transitory computer-readable medium described above, the at least one dimension includes a time dimension or a frequency dimension.

Some examples of the method, apparatus, and non-transitory computer-readable medium described above may further include processes, features, means, or instructions for transmitting a DCI message that includes an indication of a power ratio associated with the enhancement layer and the base layer for the first subset of the resource set. Some examples of the method, apparatus, and non-transitory computer-readable medium described above may further include processes, features, means, or instructions for determining the combined constellation based on the power ratio, the base modulation order, and the enhancement modulation order, where the combined constellation may be a non-uniform constellation. In some examples of the method, apparatus, and non-transitory computer-readable medium described above, the mapping to the second subset of the resource set may be performed using a uniform constellation corresponding to the extended modulation order.

In some examples of the method, apparatus, and non-transitory computer-readable medium described above, the base modulation order may be a predetermined modulation order. In some examples of the method, apparatus, and non-transitory computer-readable medium described above, the predetermined modulation order corresponds to quadrature phase shift keying (QPSK). In some examples of the method, apparatus, and non-transitory computer-readable medium described above, the enhancement modulation order corresponds to any of: QPSK, 16-quadrature amplitude modulation (QAM), or 64-QAM.

A method for wireless communication is described. The method may include receiving a transmission including a base layer associated with a first data stream and an enhancement layer associated with a second data stream, where the enhancement layer spans a resource set and the base layer spans a first subset of the resource set, determining a base modulation order associated with the base layer and an enhancement modulation order associated with the enhancement layer, de-mapping symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

An apparatus for wireless communication is described. The apparatus may include means for receiving a transmission including a base layer associated with a first data stream and an enhancement layer associated with a second data stream, where the enhancement layer spans a resource set and the base layer spans a first subset of the resource set, means for determining a base modulation order associated with the base layer and an enhancement modulation order associated with the enhancement layer, means for de-mapping symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

Another apparatus for wireless communication is described. The apparatus may include a processor, memory in electronic communication with the processor, and instructions stored in the memory. The instructions may be operable to cause the processor to receive a transmission including a base layer associated with a first data stream and an enhancement layer associated with a second data stream, where the enhancement layer spans a resource set and the base layer spans a first subset of the resource set, determine a base modulation order associated with the base layer and an enhancement modulation order associated with the enhancement layer, de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

A non-transitory computer readable medium for wireless communication is described. The non-transitory computer-readable medium may include instructions operable to cause a processor to receive a transmission including a base layer associated with a first data stream and an enhancement layer associated with a second data stream, where the enhancement layer spans a resource set and the base layer spans a first subset of the resource set, determine a base modulation order associated with the base layer and an enhancement modulation order associated with the enhancement layer, de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

Some examples of the method, apparatus, and non-transitory computer-readable medium described above may further include processes, features, means, or instructions for decoding a first transport block including the first set of de-mapped symbols and a first subset of the second set of de-mapped symbols corresponding to the enhancement modulation order. Some examples of the method, apparatus, and non-transitory computer-readable medium described above may further include processes, features, means, or instructions for decoding a second transport block including a second subset of the second set of de-mapped symbols corresponding to the base modulation order. Some examples of the method, apparatus, and non-transitory computer-readable medium described above may further include processes, features, means, or instructions for decoding a single transport block including the first set of de-mapped symbols and the second set of de-mapped symbols.

Some examples of the method, apparatus, and non-transitory computer-readable medium described above may further include processes, features, means, or instructions for determining a transport block size for the decoding based on the enhancement modulation order over the resource set and a coding rate associated with the enhancement layer. In some examples of the method, apparatus, and non-transitory computer-readable medium described above, a plurality of bits of the single transport block may be sequentially rate-matched to the resource set.

In some examples of the method, apparatus, and non-transitory computer-readable medium described above, a plurality of bits of the single transport block may be sequentially rate-matched to bit positions corresponding to the enhancement modulation order within the first subset of the resource set and the second subset of the resource set and then to bit positions corresponding to the base modulation order within the second subset of the resource set. In some examples of the method, apparatus, and non-transitory computer-readable medium described above, a plurality of bits of the single transport block may be rate-matched to bit positions corresponding to the enhancement modulation order within the first subset of the resource set and the second subset of the resource set according to a first rate-matching procedure, and the plurality of bits of the single transport block may be rate-matched to bit positions corresponding to the base modulation order within the second subset of the resource set according to a second rate-matching procedure.

Some examples of the method, apparatus, and non-transitory computer-readable medium described above may further include processes, features, means, or instructions for determining a transport block size for the decoding based on the enhancement modulation order over the first subset of the resource set, the extended modulation order over the second subset of the resource set, and a coding rate associated with the enhancement layer.

Some examples of the method, apparatus, and non-transitory computer-readable medium described above may further include processes, features, means, or instructions for receiving a DCI message that includes an indication of the enhancement modulation order. In some examples of the method, apparatus, and non-transitory computer-readable medium described above, the extended modulation order may be determined based on adding the base modulation order to the enhancement modulation order.

Some examples of the method, apparatus, and non-transitory computer-readable medium described above may further include processes, features, means, or instructions for receiving a DCI message that includes an indication of the extended modulation order. In some examples of the method, apparatus, and non-transitory computer-readable medium described above, the enhancement modulation order may be determined based on subtracting the base modulation order from the extended modulation order.

In some examples of the method, apparatus, and non-transitory computer-readable medium described above, the resource set includes a plurality of spatial layers, and at least one spatial layer of the plurality of spatial layers includes the base layer. In some examples of the method, apparatus, and non-transitory computer-readable medium described above, the at least one dimension includes a time dimension or a frequency dimension.

Some examples of the method, apparatus, and non-transitory computer-readable medium described above may further include processes, features, means, or instructions for receiving a DCI message that includes an indication of a power ratio associated with the enhancement layer and the base layer for the first subset of the resource set. Some examples of the method, apparatus, and non-transitory computer-readable medium described above may further include processes, features, means, or instructions for determining the combined constellation based on the power ratio, the base modulation order, and the enhancement modulation order, where the combined constellation may be a non-uniform constellation. In some examples of the method, apparatus, and non-transitory computer-readable medium described above, the de-mapping symbols of the second subset of the resource set may be performed using a uniform constellation corresponding to the extended modulation order.

In some examples of the method, apparatus, and non-transitory computer-readable medium described above, the base modulation order may be a predetermined modulation order. In some examples of the method, apparatus, and non-transitory computer-readable medium described above, the predetermined modulation order corresponds to QPSK. In some examples of the method, apparatus, and non-transitory computer-readable medium described above, the enhancement modulation order corresponds to any of: QPSK, 16-QAM, or 64-QAM.

DETAILED DESCRIPTION

Techniques for utilizing adaptive modulation orders for multi-user superposition transmissions (MUSTs) with non-aligned resources are described. A base station may schedule a transmission with data for multiple UEs in the same transmission time interval (e.g., subframe, etc.). Based on the relative geometries of a first and second UE, the base station may determine that data to the first and second UEs can be communicated using non-orthogonal layers of the transmission (e.g., MUST). In some cases, the base station may use aligned resources for layers associated with the first and second UE. Using aligned resources, an enhancement layer for the second UE may be superimposed onto a base layer for the first UE using a combined constellation.

Alternatively, the layers may be unaligned along at least one dimension (e.g., time, frequency, etc.). For example, a transmission may include an enhancement layer for the first UE that spans a resource set and a base layer for the second UE that spans a subset of the resource set. In this case, the base station may adapt the modulation order for the enhancement layer depending on the presence of the base layer to enhance efficiency and/or reliability for the transmission on the enhancement layer. For example, where the layers overlap the base station may modulate the transmission according to a combined constellation determined from the modulation orders associated with the base layer and enhancement layer, and a power ratio between the layers. Where the enhancement layer extends beyond the base layer, the base station may use an extended constellation to transmit coded bits to the enhancement layer UE that is determined based on the enhancement layer modulation order and the base layer modulation order. The base station may use the same or a different transport block size for the enhancement layer based on the additional coded bits carried by the extended constellation, and may perform rate-matching in a variety of ways.

Features of the disclosure introduced above are further described below in the context of a wireless communications system. Specific examples are then described of example non-orthogonal transmissions on non-aligned resources and example power distributions between layers of the transmissions. These and other features of the disclosure are further illustrated by and described with reference to apparatus diagrams, system diagrams, and flowcharts that relate to utilizing adaptive modulation orders for MUSTs with non-aligned resources.

Figure 1:
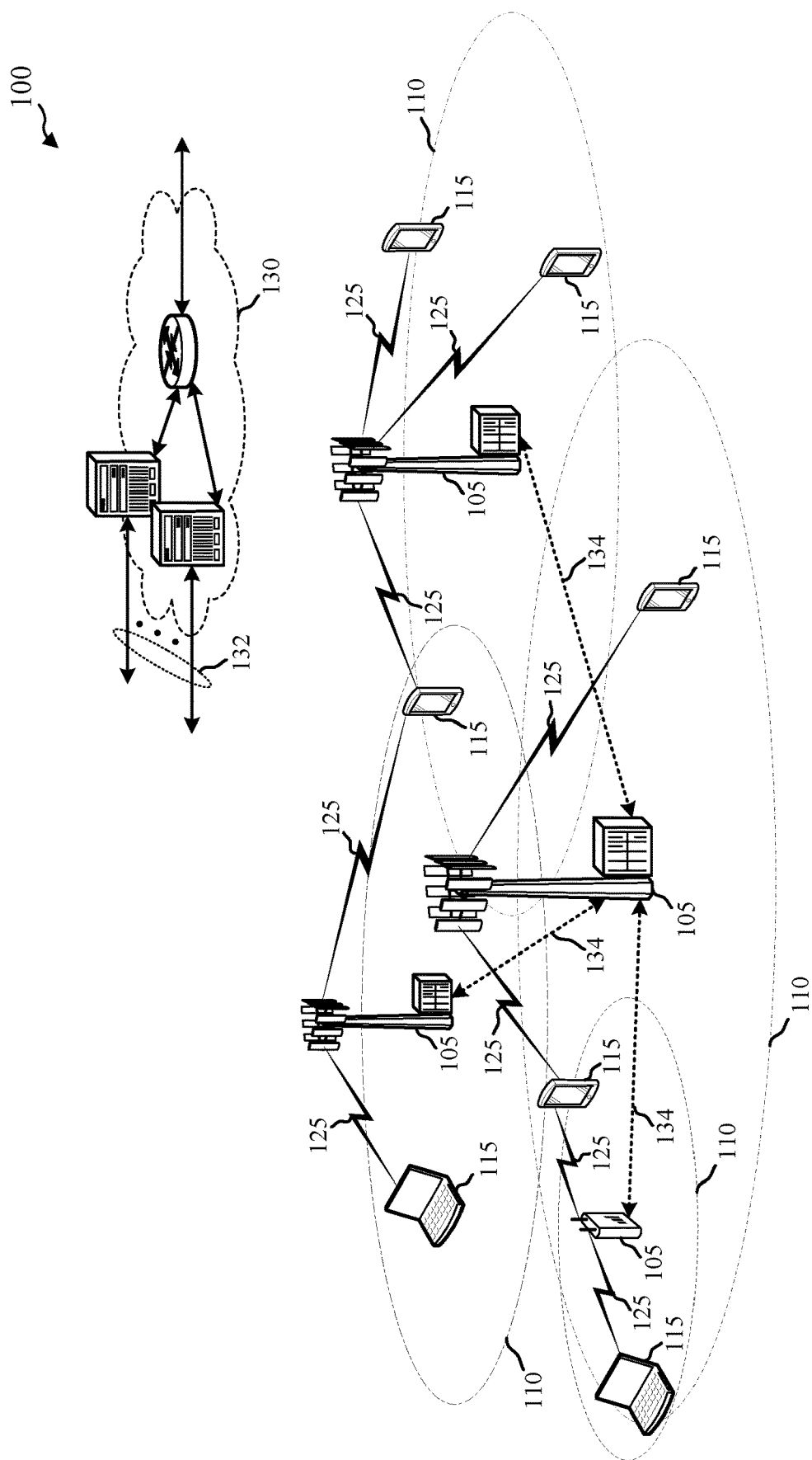
FIG. 1 illustrates an example of a wireless communications system that supports adaptive modulation order for multi-user superposition transmissions (MUSTs) with non-aligned resources in accordance with various aspects of the present disclosure.

FIG. 1 illustrates an example of a wireless communications system 100 that supports adaptive modulation orders for MUSTs in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A), or New Radio (NR) network.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. UEs 115 may be dispersed throughout the wireless communications system 100, and each UE 115 may be stationary or mobile. A UE 115 may also be referred to as a mobile station, a subscriber station, a remote unit, a wireless device, an access terminal, a handset, a user agent, a client, or some other suitable terminology. A UE 115 may be a cellular phone, a wireless modem, a handheld device, a personal computer, a tablet, a personal electronic device, an MTC device or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

Multiple Input Multiple Output (MIMO) techniques use multiple antennas at a base station 105 or multiple antennas at a UE 115 to take advantage of multipath environments and spatial resources to transmit multiple data streams. These spatial resources may be called spatial layers, and the same or different streams of data may be transmitted over different spatial layers. The use of multiple spatial layers may increase the reliability or capacity of transmissions through combining signals transmitted via different antenna ports or communicating different data streams via different antenna ports. In some cases, the use of spatial layers in wireless communications system 100 may be adaptive based on the channel quality of spatial layers. For example, a UE 115 may transmit a rank indicator (RI) indicating the number of spatial layers that support a signal-to-interference-plus-noise ratio (SINR) that is high enough for communication with the UE 115. A base station 105 may use the RI to determine the number of spatial layers to use for transmissions to the UE 115 (e.g., one (1) spatial layer for rank 1 transmissions and two (2) spatial layers for rank 2 transmissions).

A physical downlink control channel (PDCCH) may carry downlink control information (DCI) from a base station 105 to a UE 115. DCI includes information regarding downlink scheduling assignments, uplink resource grants, a transmission scheme used for transmissions, uplink power control, hybrid automatic repeat request (HARD) information, a modulation and coding scheme (MCS) used for transmissions, and other information. The size and format of the DCI messages can differ depending on the type and amount of information that is carried by the DCI. For example, if spatial multiplexing is supported, the size of the DCI message may be large compared to contiguous frequency allocations. Similarly, for a system that employs MIMO, the DCI may include additional signaling information. DCI size and format may depend on the amount of information as well as factors such as bandwidth, the number of antenna ports, and duplexing mode. PDCCH can carry DCI messages associated with multiple users, and each UE 115 may decode the DCI messages that are intended for it.

A wireless communications system 100 may use a combination of multiple-access techniques to support communication with the UEs 115 in the network. For instance, a base station 105 may use a time-frequency multiplexing technique (e.g., OFDMA), in addition to MIMO and/or multi-user superposition transmission (MUST) techniques, to send data to connected UEs 115. A non-orthogonal multiplexing scheme (e.g., MUST) may differ from other multiplexing schemes in that multiple transmissions may be sent using shared resources without orthogonal signal modulation being used. In some examples, a non-orthogonal multiplexing scheme (e.g., MUST) may instead use physical characteristics (e.g., location) of the UEs 115 to differentiate transmissions intended for one UE 115 from transmissions intended for another UE 115.

In an example of non-orthogonal multiplexing, a base station 105 may combine a first modulation scheme (e.g., quadrature phase shift keying (QPSK)) and a second modulation scheme (e.g., QPSK, 16-quadrature amplitude modulation (QAM), or 64-QAM, etc.) to construct a combined symbol constellation, which may be used to transmit a multi-layered transmission to multiple UEs. A first transmission layer (e.g., a base layer) of the transmission may be associated with the first modulation scheme, and a second transmission layer (e.g., an enhancement layer) of the transmission may be associated with the second modulation scheme. The combined symbol constellation may be determined based on the modulation order associated with the base layer, the modulation order associated with the enhancement layer, and a power ratio between the base layer and enhancement layer.

An enhancement layer UE 115 may be configured to receive a companion DCI included in the PDCCH from a base station 105. The companion DCI may provide information related to the base layer. For example, the companion DCI may include information about the modulation order or MCS associated with the base layer, the resource allocation of the base layer, a starting symbol associated with the base layer, a power ratio associated with the base layer, etc. The companion DCI message may be intended for the enhancement layer UE 115 and may be supplemental to an enhancement layer UE 115 self-DCI message that includes the DCI related to the enhancement layer.

Using information included in the companion DCI, an enhancement layer UE 115 may determine the resource allocation of a base layer UE 115. The enhancement layer UE 115 may receive a transmission including a base layer spanning a base layer resource set and an enhancement layer spanning an enhancement layer resource set. In some examples, the base layer resource set may be aligned with the enhancement layer resource set or may be a super-set of the enhancement layer resource set. In such cases, the enhancement layer UE 115 may de-map symbols of the enhancement layer resource set of the transmission using a combined constellation. In other examples, the base layer resource set may be a subset of the enhancement layer resource set (e.g., in the time domain or frequency domain). In such cases, the enhancement layer UE 115 may de-map symbols of the enhancement layer resource set of the transmission using a combined constellation, and may de-map symbols of the enhancement layer resource set of the transmission that do not overlap with the base layer resource set using an extended constellation. The extended constellation may be constructed according to an extended modulation order derived from adding the base modulation order and the enhancement modulation order. By using the extended modulation order for aspects of the transmission, base station 105 may increase the reliability of the transmission to an enhancement layer UE and/or increase the amount of data in the enhancement layer.

Figure 2:
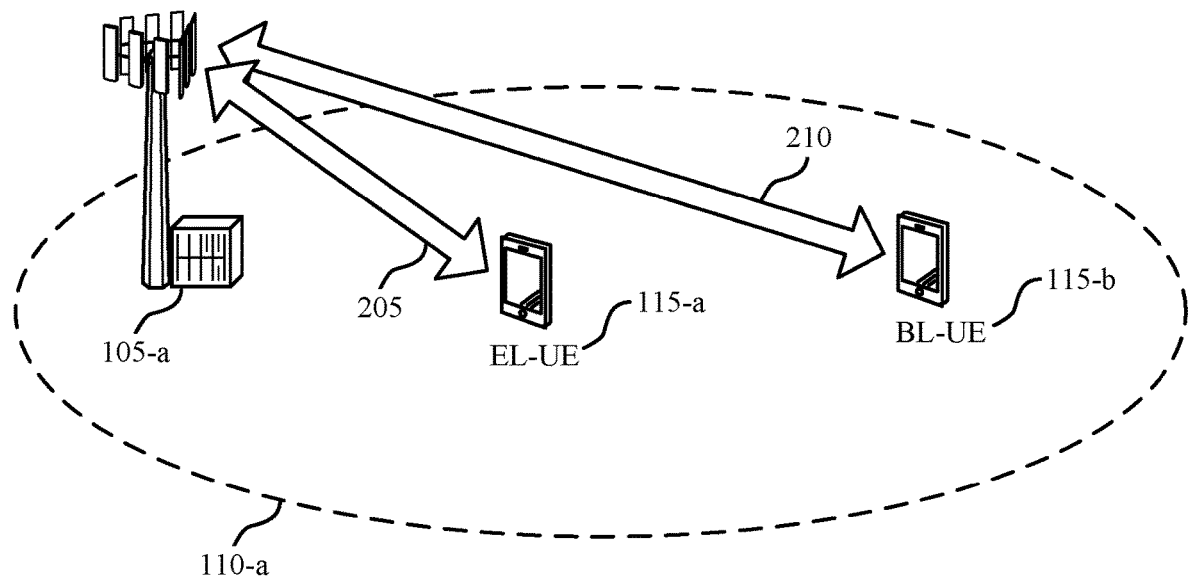
FIG. 2 illustrates an example of a wireless communications system that supports adaptive modulation order for MUSTs with non-aligned resources in accordance with various aspects of the present disclosure.

FIG. 2 illustrates an example of a wireless communications system 200 that supports adaptive modulation orders for MUSTs in accordance with various aspects of the present disclosure. Wireless communications system 200 may include enhancement layer UE 115-a, base layer UE 115-b, and base station 105-a, which may be examples of a UE 115 or a base station 105 and may communicate with one another as described above with reference to FIG. 1. Enhancement layer UE 115-a may be capable of operating in a MUST mode—e.g., may be configured for cancellation of base layers and/or MUST-specific processing—and may be dynamically configured to operate in the MUST mode by base station 105-a. Enhancement layer UE 115-a may also be configured for utilizing adaptive modulation orders for MUST transmissions on non-aligned resources. Base layer UE 115-b may be capable of operating in the MUST mode but, in the illustrated wireless communications system 200, may not be configured with any MUST-specific capabilities.

In the example of FIG. 2, base station 105-a may configure enhancement layer UE 115-a to operate in a MUST mode (e.g., via RRC signaling, etc.) and may pair enhancement layer UE 115-a with base layer UE 115-b for one or more MUST transmissions. Base station 105-a may then determine a base modulation order (e.g., 2) for transmissions to base layer UE 115-b and an enhancement modulation order (e.g., 2, 4, 6, etc.) for transmissions to enhancement layer UE 115-a. In some cases, base station 105-a may determine the enhancement modulation order based on desired data rates and/or reliability of transmissions to enhancement layer UE 115-a, and the base modulation order may be predetermined. Enhancement layer UE 115-a may identify a desired modulation order for communication with base station 105-a and include an indication of the desired modulation order in, for example, a CQI report. In one scenario, base station 105-a may determine to use QPSK (modulation order 2) for transmissions to base layer UE 115-b and 16-QAM (modulation order 4) for transmissions to enhancement layer UE 115-a. In this way, base station 105-a may transmit more data to enhancement layer UE 115-a than to base layer UE 115-b. In another scenario, base station 105-a may determine to use QPSK for transmissions to base layer UE 115-b and QPSK for transmissions to enhancement layer UE 115-a—e.g., to increase reliability (e.g., decrease a bit error rate (BER)) of transmissions to enhancement layer UE 115-a. Base station 105-a may also adjust the power ratio between the base layer and enhancement layer to provide desired transmission reliability for a given modulation order.

In some examples, a transmission from a base station 105-a may include an enhancement layer 205 spanning a resource set and a base layer 210 spanning a first subset of the resource set. The base station 105-a may modulate the transmission on the first subset of the resource set according to a combined constellation, which may be associated with a non-uniform power distribution across the constellation. For example, base station 105-a may distribute more power to the base layer 210 than to the enhancement layer 205 since the base layer 210 may have a lower geometry (e.g., lower SNR, farther from base station 105-a) than the enhancement layer. Additionally, the base station 105-a may modulate the transmission on the resource set exclusive of the first subset of the resource set according to an extended constellation. Since there are no overlapping base layers on these resources, the base station may distribute power uniformly across the extended constellation. That is, each bit position in the constellation may be allocated the same amount of power (e.g., uniform distance between constellation points).

In some cases, base station 105-a may indicate a modulation order associated with the enhancement layer 205 in a control message transmitted to enhancement layer UE 115-a. Base station 105-a may include the modulation order in an MCS portion of the control message (e.g., in an enhancement layer UE 115-a self-DCI message). In some examples, the indicated modulation order may be the enhancement modulation order, and, in other examples, the indicated modulation order may be the extended modulation order. If the indicated modulation order is the enhancement modulation order, enhancement layer UE 115-a may determine the extended modulation order based on the base modulation order and the indicated enhancement modulation order. For example, if the enhancement modulation order supports two (2) bits and the base modulation order supports two (2) bits, enhancement layer UE 115-a may sum these values and determine that the extended modulation order supports four (4) bits. Alternatively, if the indicated modulation order is the extended modulation order, enhancement layer UE 115-a may determine the enhancement modulation order based on the base modulation order and the indicated extended modulation order. For example, if the extended modulation order supports four (4) bits and the base modulation order supports two (2) bits, enhancement layer UE 115-a may find the difference between these values and determine that the enhancement modulation order supports two (2) bits.

In some examples, MUST techniques may be combined with MIMO techniques for transmissions on multiple spatial layers. As described above with reference to FIG. 1, an enhancement layer UE 115-a may transmit an RI to base station 105-a indicating a number of spatial layers that support a SINR that is high enough for communication with the enhancement layer UE 115-a. Similarly, a base layer UE 115-a may transmit an RI to base station 105-a indicating a number of spatial layers that support a SINR that is high enough for communication with the base layer UE 115-a. In the case that both UEs are capable of communicating on multiple spatial layers, base station 105-a may schedule a transmission across the multiple spatial layers to enhancement layer UE 115-a and base layer UE 115-b using MUST techniques. In some cases, the transmission on each spatial layer may include overlapping transmission layers (i.e., a base layer and an enhancement layer) on a first subset of a resource set and a single transmission layer (i.e., an enhancement layer) on a second subset of the resource set. Accordingly, enhancement layer UE 115-a may determine an extended modulation order for each spatial layer and use the extended modulation orders to de-map symbols on the second subset of the resource set.

Figure 3A:
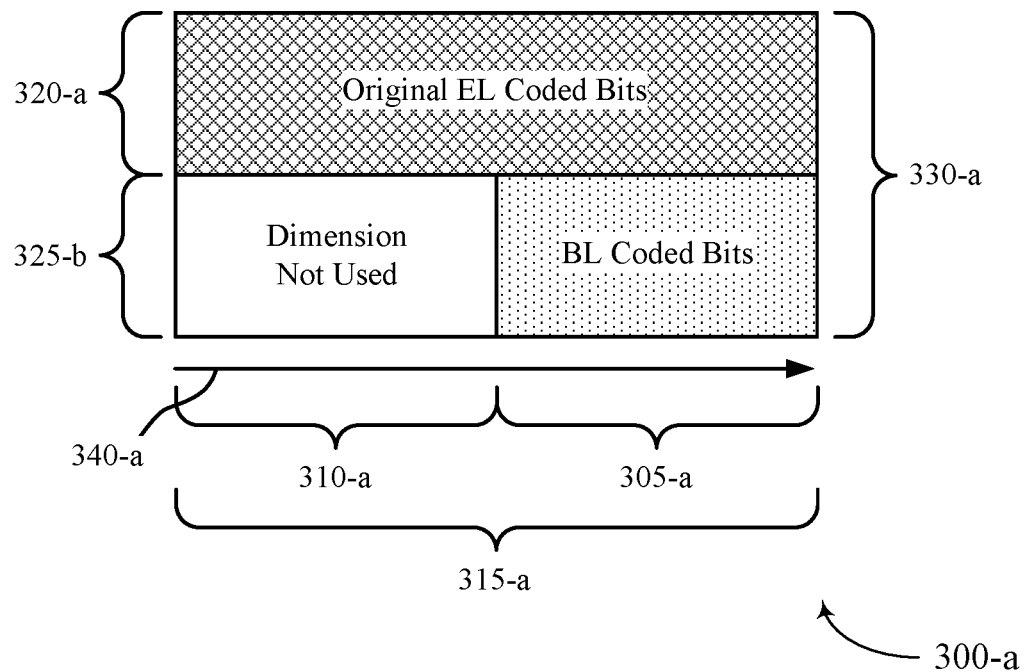
FIGS. 3A and 3B illustrate examples of a transmission on different MUST transmission layers with non-aligned resources in accordance with various aspects of the present disclosure.

FIG. 3A illustrates an example of a transmission 300-a on different MUST transmission layers with non-aligned resources in accordance with various aspects of the present disclosure. In this example, transmission 300-a includes an enhancement layer on a resource set 315-a and a base layer on a first subset of the resource set 305-a. The resource set is shown along resource dimension 340-a, where the resource set associated with the enhancement layer spans the first subset of the resource set 305-a and extends beyond the first subset of the resource set 305-a along the resource dimension 340-a. Resource dimension 340-a may be, for example, the time dimension or frequency dimension. In some cases, the resource set 315-a may extend beyond the first subset of the resource set 305-a in more than one dimension. The enhancement layer may be modulated according to an enhancement modulation order 320-a, and the base layer may be modulated according to a base modulation order 325-a, which may be a predetermined modulation order. A combined constellation may be used to map symbols to the first subset of the resource set 305-a.

In some cases, the base station 105 may modulate the coded bits for the enhancement layer on the second subset of the resource set 310-a according to the enhancement modulation order 320-a. However, because there is no base layer on the second subset of the resource set 310-a, this may result in an inefficient use of resources since the base station 105 would not be utilizing all the available transmission power over the second subset of the resource set 310-a.

Figure 3B:
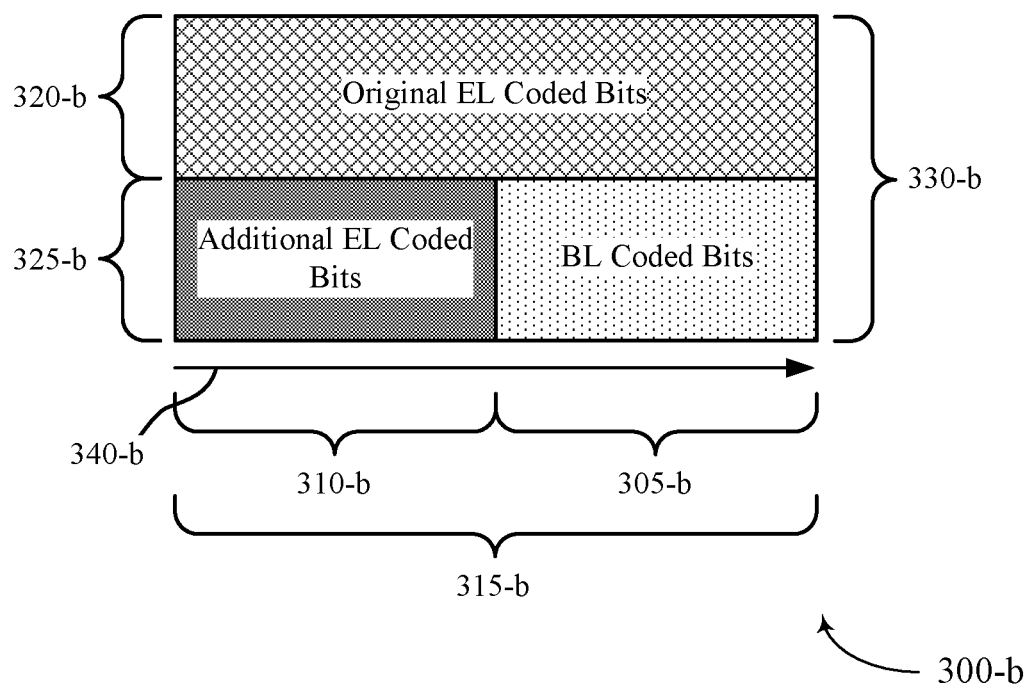

FIG. 3B illustrates an example of a transmission 300-b utilizing adaptive modulation orders for MUSTS with non-aligned resources, in accordance with various aspects of the present disclosure. In this example, transmission 300-b includes an enhancement layer on a resource set 315-b and a base layer on a first subset of the resource set 305-b. The resource set is shown along resource dimension 340-b, where the resource set 315-b associated with the enhancement layer spans the first subset of the resource set 305-b and extends beyond the first subset of the resource set 305-b along the resource dimension 340-b (e.g., time, frequency, etc.). In some examples, the base layer may extend beyond the first subset of the resource set (e.g., in a different direction along the resource dimension 340-b than the extension of the resource set 315-b, in a different dimension, etc.). The transmission on the first subset of the resource set 305-b may be modulated according to a combined constellation determined based on base modulation order 325-b, enhancement modulation order 320-b, and a power ratio between the base layer and enhancement layer. The transmission on the second subset of the resource set 310-b may be modulated according to an extended constellation constructed according to an extended modulation order 330-b. The extended modulation order 330-b may be determined based on adding the enhancement modulation order 320-b to the base modulation order 325-b.

In some cases, a UE 115 may transmit an indication of a supported modulation order based on SINR estimates and channel quality. For example, the UE 115 may indicate a supported modulation order (e.g., enhancement modulation order 320-b, extended modulation order 330-b) in a CQI report. Base station 105 may modulate a transmission on the second subset of the resource set 310-b according to the extended modulation order 330-b, which may be the indicated modulation order or may be determined from the indicated modulation order and the base modulation order. Base station 105 may transmit an indication of a modulation order associated with the enhancement layer in the MCS portion of a DCI message. In some cases, the modulation order included in the DCI message may be the enhancement modulation order, and UE 115 may determine the number of bits associated with the extended modulation order by adding the number of bits associated with the base layer to the number of bits associated with the enhancement layer. In other cases, the modulation order included in the DCI message may be the extended modulation order, and UE 115 may determine the number of bits associated with the enhancement modulation order by subtracting the number of bits associated with the base modulation order from the number of bits associated with the extended modulation order.

Figure 4A:
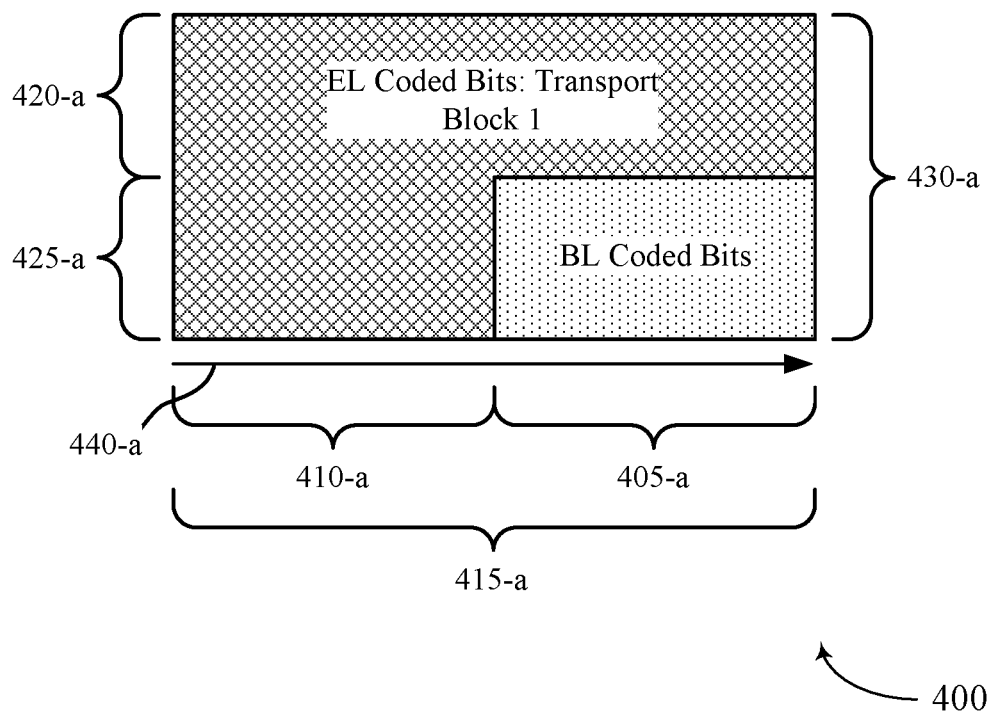
FIGS. 4A and 4B illustrate examples of a transmission on different MUST transmission layers with non-aligned resources in accordance with various aspects of the present disclosure.

FIG. 4A illustrates an example of a transmission 400-a utilizing adaptive modulation orders for MUSTs with non-aligned resources, in accordance with various aspects of the present disclosure. In this example, transmission 400-*a* includes an enhancement layer on a resource set 415-*a* and a base layer on a first subset of the resource set 405-*a*. The resource set is shown along resource dimension 440-*a*, where the resource set 415-*a* associated with the enhancement layer spans the first subset of the resource set 405-*a* and extends beyond the first subset of the resource set 405-*a* along the resource dimension 440-*a* (e.g., time, frequency, etc.). In some examples, the base layer may extend beyond the first subset of the resource set (e.g., in a different direction along the resource dimension 440-*a* than the extension of the resource set 415-*a*, in a different dimension, etc.). The transmission on the first subset of the resource set 405-*a* may be modulated according to a combined constellation determined from the base modulation order 425-*a*, the enhancement modulation order 420-*a*, and the power ratio between the base layer and the enhancement layer. The transmission on the second subset of the resource set 410-*a* may be modulated according to an extended constellation constructed according to an extended modulation order 430-*a*. The extended modulation order 430-*a* may be a uniform constellation determined based on adding the enhancement modulation order 420-*a* to the base modulation order 425-*a*.

In transmission 400-*a*, base station 105 encodes the enhancement layer portion of transmission 400-*a* as a single transport block. In some cases, the base station 105 may use the extra available coded bits of the second subset of the resource set 410-*a* to increase redundancy of the transport block (e.g., filling the extra bits with additional parity bits, etc.). For example, the base station 105 may determine the size of the single transport block based on the enhancement modulation order 420-*a* over the resource set 415-*a* and a coding rate associated with the enhancement layer. In other cases, the base station 105 may fill the additional coded bits resulting from the increased modulation order in the second subset of the resource set 410-*a* with a combination of additional data bits and parity bits according to the coding rate associated with the enhancement layer. For example, the base station 105 may determine the size of the single transport block based on the enhancement modulation order 420-*a* over the first subset of the resource set 405-*a*, the extended modulation order 430-*a* over the second subset of the resource set 410-*a*, and a coding rate associated with the enhancement layer. That is, the transport block size for the enhancement layer may be increased based on the extra available bits in the extended set of resources 410-*a*.

Figure 4B:
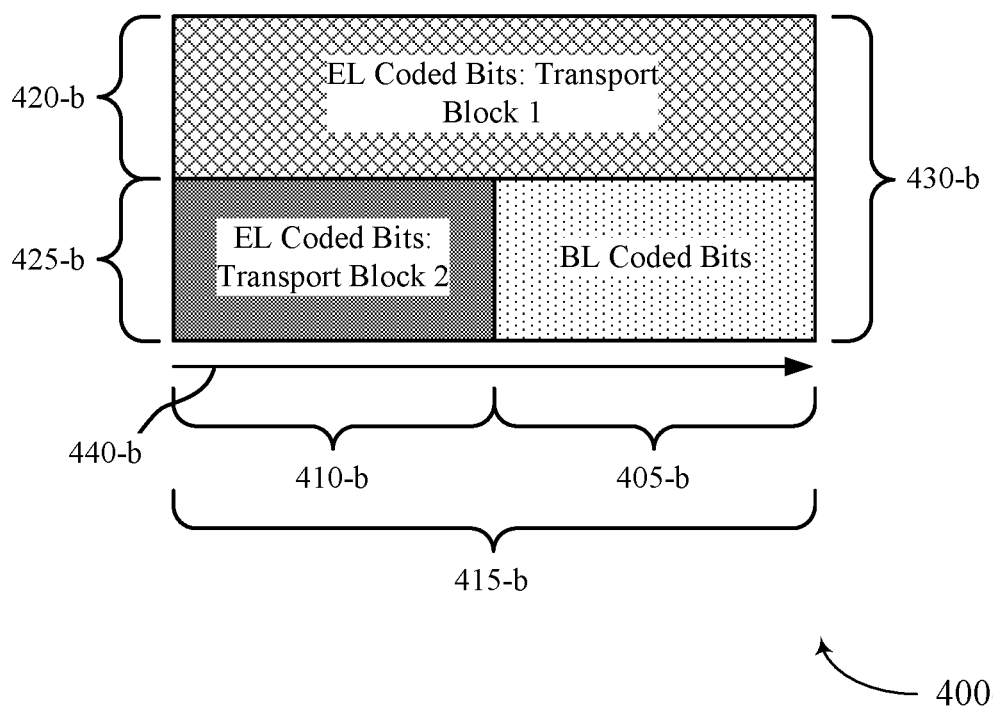

FIG. 4B illustrates an example of a transmission 400-*b* utilizing adaptive modulation orders for MUSTS with non-aligned resources, in accordance with various aspects of the present disclosure. In this example, transmission 400-*b* includes an enhancement layer on a resource set 415-*b* and a base layer on a first subset of the resource set 405-*b*. The resource set is shown along resource dimension 440-*b*, where the resource set 415-*b* associated with the enhancement layer spans the first subset of the resource set 405-*b* and extends beyond the first subset of the resource set 405-*b* along the resource dimension 440-*b* (e.g., time, frequency, etc.). In some examples, the base layer may extend beyond the first subset of the resource set (e.g., in a different direction along the resource dimension 440-*b* than the extension of the resource set 415-*b*, in a different dimension, etc.). The transmission on the first subset of the resource set 405-*b* may be modulated according to a combined constellation determined from the base modulation order 425-*b*, the enhancement modulation order 420-*b*, and the power ratio between the base layer and enhancement layer. The transmission on the second subset of the resource set 410-*b* may be modulated according to an extended constellation, which may be a uniform constellation having the extended modulation order 430-*b*. The extended modulation order 430-*b* may be determined based on adding the enhancement modulation order 420-*b* to the base modulation order 425-*b*.

In this example, base station 105 encodes the bits associated with the enhancement modulation order 420-*b* across the resource set 415-*b* as a first transport block (i.e., transport block 1), and base station 105 encodes the bits associated with the base modulation order 425-*b* across the second subset of the resource set 410-*b* as a second transport block (i.e., transport block 2). The transport block size of the first transport block may be determined based on the enhancement modulation order 420-*b*, the size of the resource set 415-*b*, and a coding rate associated with the enhancement layer. The transport block size of the second transport block may be determined based on the base modulation order 425-*b*, the size of the second subset of the resource set 410-*b*, and a coding rate associated with the enhancement layer. By using adaptive modulation techniques, base station 105 may have access to additional bits in the second transport block for communication with the enhancement layer UE 115.

Figure 5A:
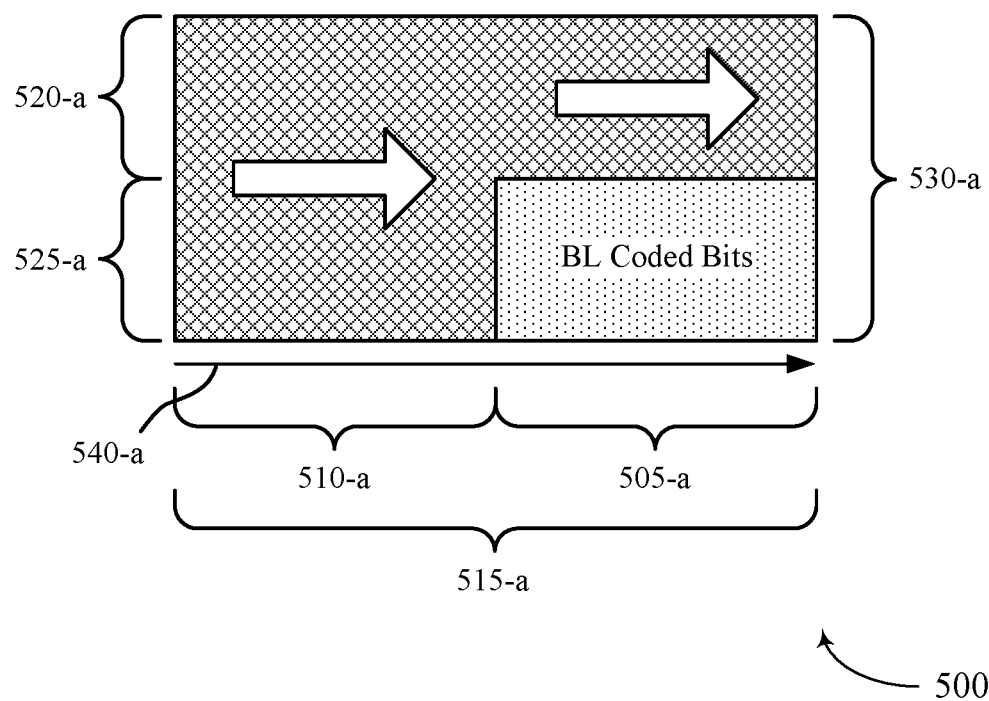
FIGS. 5A and 5B illustrate examples of a transmission on different MUST transmission layers with non-aligned resources in accordance with various aspects of the present disclosure.

FIG. 5A illustrates an example of a transmission 500-*a* utilizing adaptive modulation orders for MUSTS with non-aligned resources, in accordance with various aspects of the present disclosure. In this example, transmission 500-*a* includes an enhancement layer on a resource set 515-*a* and a base layer on a first subset of the resource set 515-*a*. The resource set is shown along resource dimension 540-*a*, where the resource set 515-*a* associated with the enhancement layer spans the first subset of the resource set 505-*a* and extends beyond the first subset of the resource set 505-*a* along the resource dimension 540-*a* (e.g., time, frequency, etc.). In some examples, the base layer may extend beyond the first subset of the resource set (e.g., in a different direction along the resource dimension 540-*a* than the extension of the resource set 515-*a*, in a different dimension, etc.). The transmission on the first subset of the resource set 505-*a* may be modulated according to a combined constellation determined from the base modulation order 525-*a*, the enhancement modulation order 520-*a*, and a power ratio between the base layer and enhancement layer. The transmission on the second subset of the resource set 510-*a* may be modulated according to an extended constellation, which may be a uniform constellation having the extended modulation order 530-*a*. The extended modulation order 530-*a* may be determined based on adding the enhancement modulation order 520-*a* to the base modulation order 525-*a*.

In transmission 500-*a*, base station 105 encodes the enhancement layer portion of transmission 500-*a* as a single transport block. Base station 105 may sequentially rate-match a data stream of the enhancement layer portion of the transmission to the resource set 515-*a*, and adapt the modulation order based on the presence of the base layer. Specifically, base station 105 may rate-match the data stream to the resource set 515-*a* (e.g., resource blocks, symbols, etc.) to all bits of each symbol in order of increasing resource index. For example, the second subset of the resource set 510-*a* may have lower resource indices than the first subset of the resource set, and base station 105 may initially rate-match the data stream of the enhancement layer to all the bits of the extended modulation order in the second subset of the resource set 510-*a*. Base station 105 may then rate-match the data stream of the enhancement layer to the bits of the combined constellation associated with the enhancement modulation order for the first subset of the resource set 505-*a*.

Figure 5B:
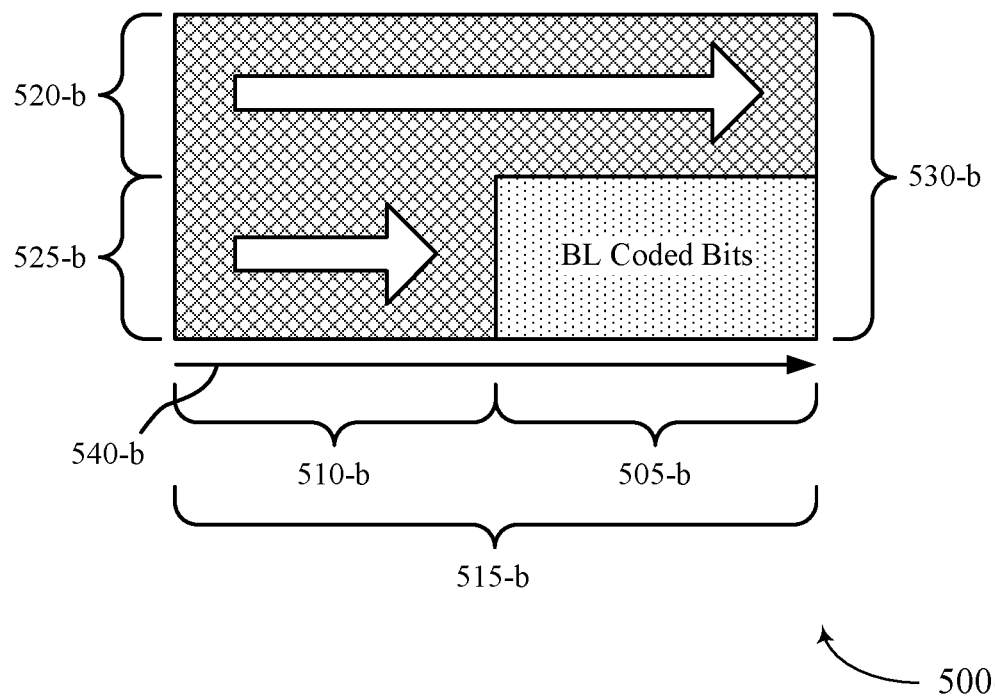

FIG. 5B illustrates an example of a transmission 500-*b* utilizing adaptive modulation orders for MUSTS with non-aligned resources, in accordance with various aspects of the present disclosure. In this example, transmission 500-*b* includes an enhancement layer on a resource set 505-*b* and a base layer on a first subset of the resource set 515-*b*. The resource set is shown along resource dimension 540-*b*, where the resource set 515-*b* associated with the enhancement layer spans the first subset of the resource set 505-*b* and extends beyond the first subset of the resource set 505-*b* along the resource dimension 540-*b* (e.g., time, frequency, etc.). In some examples, the base layer may extend beyond the first subset of the resource set (e.g., in a different direction along the resource dimension 540-*b* than the extension of the resource set 515-*b*, in a different dimension, etc.). The transmission on the first subset of the resource set 505-*b* may be modulated according to a combined constellation determined from the base modulation order 525-*b*, the enhancement modulation order 520-*b*, and the power ratio between the base layer and enhancement layer. The transmission on the second subset of the resource set 510-*b* may be modulated according to an extended constellation, which may be a uniform constellation having the extended modulation order 530-*b*. The extended modulation order 530-*b* may be determined based on adding the enhancement modulation order 520-*a* to the base modulation order 525-*b*.

Transmission 500-*b* is illustrated with the enhancement layer encoded as a single transport block. Base station 105 may sequentially rate-match a data stream of the enhancement layer portion of the transmission to the first subset of the resource set 505-*b* and the second subset of the resource set 510-*b* corresponding to the enhancement modulation order 520-*b* and then to the second subset of the resource set 510-*b* corresponding to the base modulation order 525-*b*. Specifically, base station 105 may rate-match the data stream to the first subset of the resource set 505-*b* and the second subset of the resource set 510-*b* corresponding to the enhancement modulation order 520-*b* in order of increasing resource index, and then base station 105 may rate-match the data stream to the second subset of the resource set 510-*b* corresponding to the base modulation order 525-*b* in order of increasing resource index.

Base station 105 may perform the rate-matching for the set of coded bits in a single rate-matching procedure that accounts for the additional bits in the second subset of the resource set 510-*b*. For example, base station 105 may determine a rate-matching target size based on the enhancement modulation order over the first subset of the resource set and the extended modulation order over the second subset of the resource set. The base station 105 may begin rate-matching the coded bits of the data stream to bit positions corresponding to the enhancement modulation order across the resource set 515-*b* (e.g., mapping only to the bit positions corresponding to the enhancement modulation order in the second subset of the resource set 510-*b*). Base station 105 may then rate-match the remaining bits of the set of coded bits of the data stream to the bit positions corresponding to the base modulation order 525-*b* across the second subset of the resource set 510-*b*.

Alternatively, base station 105 may perform a first rate-matching procedure to rate-match the data stream associated with the enhancement layer to the first subset of the resource set 505-*b* and the second subset of the resource set 510-*b* corresponding to the enhancement modulation order 520-*b*, and perform a second rate-matching procedure to rate-match the data stream to the second subset of the resource set 510-*b* corresponding to the base modulation order 525-*b*. Specifically, base station 105 may determine a first target size for the first rate-matching procedure based on the enhancement modulation order over the resource set 515-*b*. The base station 105 may perform the first rate-matching procedure to rate-match the data stream to the bit positions corresponding to the enhancement modulation order in the first subset of the resource set 505-*b* and the second subset of the resource set 510-*b* in order of increasing resource index. Base station 105 may then determine a second target size for the second rate-matching procedure based on the base modulation order 525-*b* over the second subset of the resource set 510-*b*. Base station 105 may then perform the second rate-matching procedure to rate-match the data stream to the bit positions corresponding to the base modulation order 525-*b* in the second subset of the resource set 510-*b* in order of increasing resource index. That is, the first rate-matching procedure may include rate-matching a set of coded bits of the data stream to the first target size, and the second rate-matching procedure may include rate-matching the same set of coded bits to the second target size.

Figure 6:
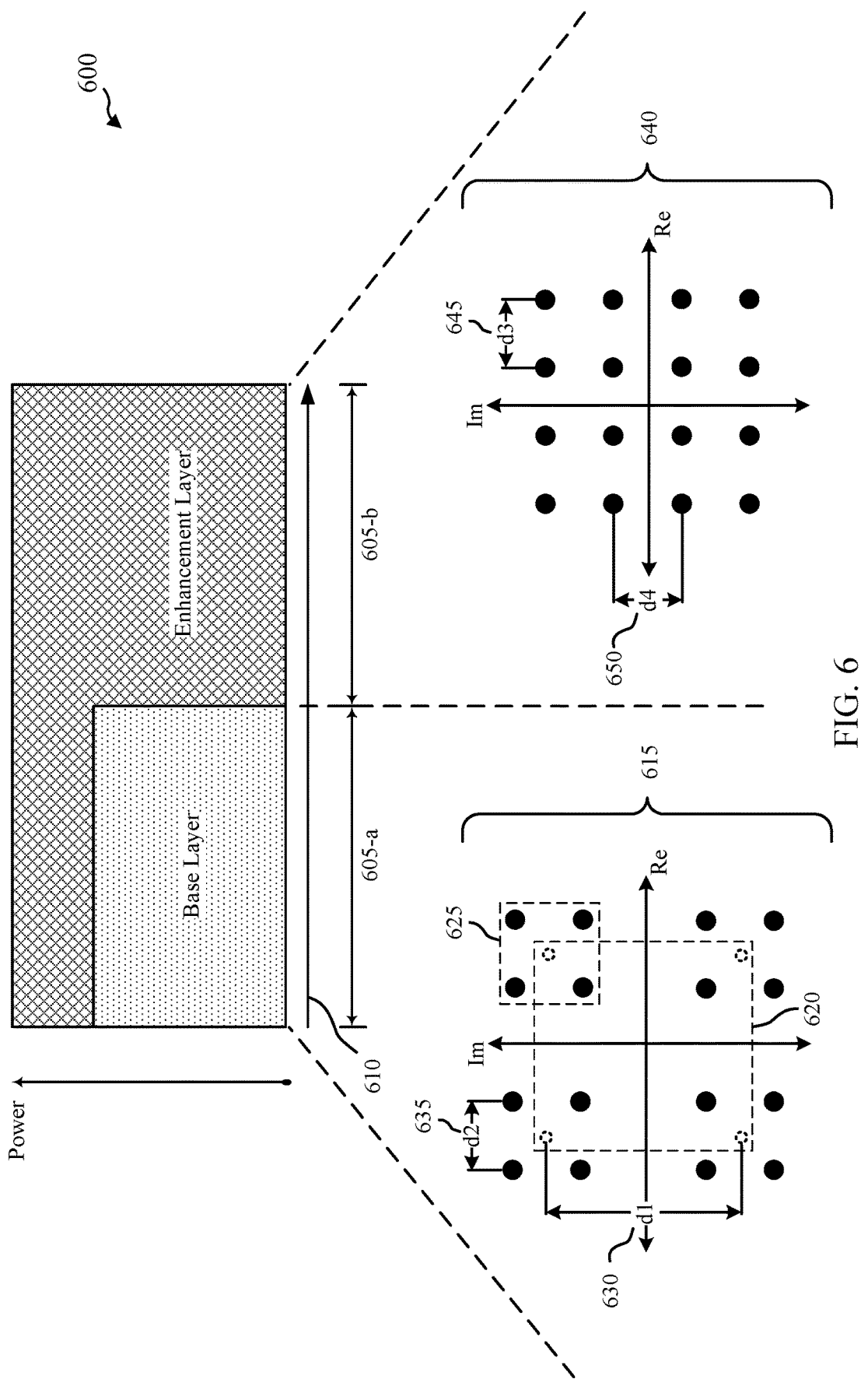
FIG. 6 illustrates an example of a power distribution in a transmission on different MUST transmission layers with non-aligned resources in accordance with various aspects of the present disclosure.

FIG. 6 illustrates an example of a power distribution 600 in a transmission on different MUST transmission layers with non-aligned resources in accordance with various aspects of the present disclosure. The transmission may be an example of transmissions 300-500 discussed with reference to FIG. 3 through 5 or transmission 700 discussed with reference to FIG. 7. Specifically, the transmission may include a base layer on a first subset of a resource set 605-*a* and an enhancement layer on the first subset of the resource set 605-*a* and a second subset of the resource set 605-*b*. The resource set is shown along resource dimension 610, where the enhancement layer extends beyond the first subset of the resource set 605-*a* along the resource dimension 610. For the portion of the transmission on the first subset of the resource set 605-*a*, the power distribution between the base layer and the enhancement layer may be non-uniform. For example, the base station 105 may allocate more of the available power for the transmission to the base layer.

Base station 105 may modulate the portion of the transmission on the first subset of the resource set 605-*a* according to a combined constellation 615. In this example, the combined constellation may include a first symbol constellation 620, constructed according to a base modulation order (e.g., 2), and a second symbol constellation 625, constructed according to an enhancement modulation order (e.g., 2) that may be superimposed over the first symbol constellation 620. In other examples, the enhancement modulation order may be any of: 2, 4, 8, etc. (not shown). The combined constellation may be constructed according to a power ratio determined based on the supported modulation orders and the relative geometries of a base layer UE and an enhancement layer UE. The power ratio may be between the first symbol constellation 620 and the second symbol constellation 625. Specifically, the power ratio may correspond to the distance 630 between the symbols of the first symbol constellation 620 (i.e., d1) and the distance 635 between the symbols of the second symbol constellation 625 (i.e., d2). Base station 105 may use the power ratio to separate a single transmission into multiple layers—e.g., an enhancement layer corresponding to the second data stream and a base layer corresponding to the first data stream.

In some examples, such as an example where each of the first symbol constellation 620 and the second symbol constellation 625 are constructed according to a QPSK modulation scheme, the power ratio between the portion allocated to the base layer and the power allocated to the total transmission may follow the equation:

$$P_r = 1 \bigg/ \left(\left(\frac{d_2}{d_1}\right)^2 + 1\right).$$

As illustrated in FIG. 6, the power ratio results in a non-uniform distribution of power between the base layer and the enhancement layer on the first subset of the resource set 605-*a*. Base station 105 may transmit the power ratio to an enhancement layer UE 115 in, for example, a DCI message to allow the enhancement layer UE 115 to determine the power allocated to each transmission layer. The enhancement layer UE 115 may then determine the combined constellation (i.e., non-uniform constellation) based on the power ratio, the base modulation order, and the enhancement modulation order, and the enhancement layer UE 115 may use the combined constellation to de-map symbols of the transmission. The base layer UE may perceive the enhancement layer as interference and de-map symbols of the transmission based only on the first symbol constellation 620 (i.e., without information about the second symbol constellation 625 or the power ratio).

Base station 105 may then modulate the portion of the transmission on the second subset of the resource set 605-*b* according to a uniform extended constellation 640. The uniform extended constellation 640 may be determined based on an extended modulation order that may be determined from the base modulation order associated with the first symbol constellation 620 and the enhancement modulation order associated with the second symbol constellation 625. Accordingly, the power ratio may not apply since there is no base layer and power may be distributed uniformly across the constellation (e.g., distance 645 ($d_3$) is equal to distance 650 ($d_4$)). The enhancement layer UE 115 may determine that the portion of the transmission on the second subset of the resource set 605-*b* does not include a base layer and identify that the power distribution on the second subset of the resource set 605-*b* is uniform. The enhancement layer UE 115 may then de-map symbols of the second subset of the resource set 605-*b* using the uniform extended constellation corresponding to the extended modulation order.

As described above with reference to FIGS. 3 through 5, the first subset of the resource set 605-*a* and the second subset of the resource set 605-*b* may be associated with resource dimension 610. The resource dimension 610 may be a frequency dimension and the resources may be resource blocks allocated for a MUST transmission to an enhancement layer UE and a base layer UE. In the examples described with reference to FIGS. 3 through 5, the enhancement layer may extend beyond resources allocated to a base layer in the frequency dimension. Alternatively, the resource dimension may be a time dimension.

Figure 7:
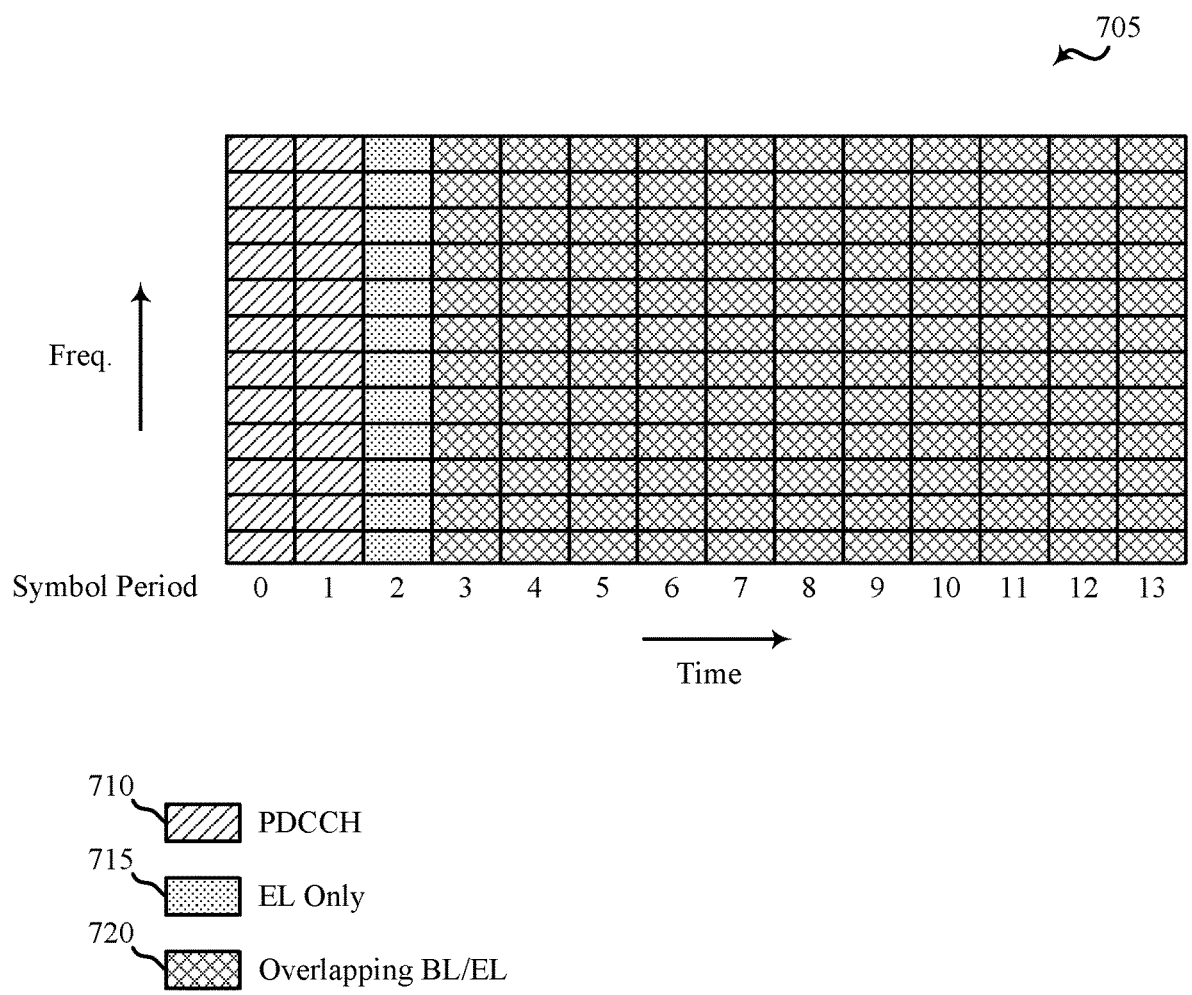
FIG. 7 illustrates an example of a transmission on different MUST transmission layers with non-aligned resources in accordance with various aspects of the present disclosure.

FIG. 7 illustrates an example of a transmission 700 on different MUST transmission layers in a resource block 705 with non-aligned resources in accordance with various aspects of the present disclosure. In this example, transmission 700 may include a base layer and an enhancement layer. A base layer UE (e.g., BL-UE 115-*b*) may be cross-carrier scheduled onto a base layer for communication on resources of a carrier including one or more resource blocks 705 in a system supporting carrier aggregation. The base layer UE may be scheduled to receive signals on a physical downlink shared channel (PDSCH) with a fixed starting symbol (e.g., symbol 3) in a subframe of one or more resource blocks 705. An enhancement layer UE may be locally scheduled on the same one or more resource blocks 705 with a starting symbol (e.g., symbol 2) in the subframe, and the first two symbols (e.g., symbol 0 and symbol 1) may be reserved for a physical downlink control channel (PDCCH) 710. Therefore, a PDSCH transmission on symbol 3 and subsequent symbols may include overlapping layers 720 (i.e., a base layer and an enhancement layer). However, symbol 2 carries only the enhancement layer 715. Accordingly, as described above with reference to FIGS. 3 through 6, symbol 2 may represent a second subset of a resource set, and base station 105 may modulate coded bits associated with the enhancement layer for symbol 2 according to an extended modulation order to gain access to additional bits for communication with an enhancement layer UE.

Figure 8:
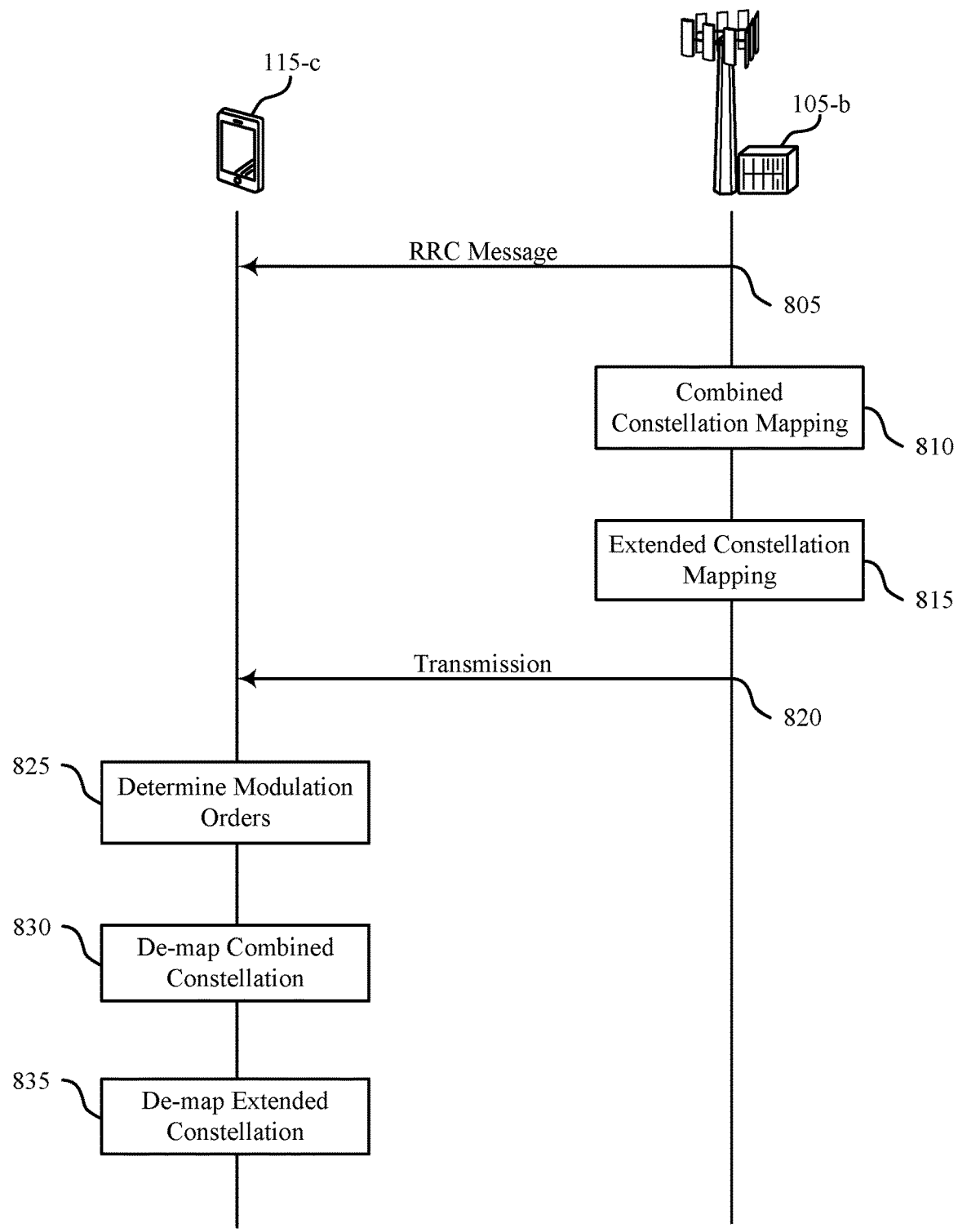
FIG. 8 illustrates an example of a process flow in a system that supports adaptive modulation order for MUSTs with non-aligned resources in accordance with various aspects of the present disclosure.

FIG. 8 illustrates an example of a process flow 800 in a system that supports adaptive modulation order for MUSTs with non-aligned resources in accordance with various aspects of the present disclosure. Process flow 800 may include steps performed by UE 115-*c* which may be an example a UE 115 described above with reference to FIG. 1 and/or a UE 115-*a* described above with reference to FIG. 2. Process flow 800 may also include steps performed by a base station 105-*b*, which may be an example of a base station 105 described with reference to FIGS. 1 and 2.

At step 805, base station 105-*b* may transmit an RRC message to UE 115-*c*. The RRC message may include a configuration for UE 115-*c* that indicates whether adaptive modulation orders for MUSTs may be used for future transmissions.

At block 810, base station 105-*b* may determine a combined constellation to use for mapping symbols for a transmission to UE 115-*c*. The combined constellation may be based on a base modulation order associated with a base layer and an enhancement modulation order associated with an enhancement layer. The base modulation order may be a predetermined modulation order (e.g., QPSK), and the enhancement modulation order may be any of: QPSK, 16-QAM, 64-QAM. In some cases, the distribution of power in the combined constellation may be non-uniform as discussed with reference to FIG. 6. Base station 105-*b* may map a first encoded bit stream for a UE 115 (e.g., UE 115-*b*) and a first portion of a second encoded bit stream for UE 115-*c* to a first subset of a resource set using the combined constellation.

At block 815, base station 105-*b* may determine an extended constellation mapping to use for mapping symbols for a transmission to UE 115-*c*. The extended constellation may be based on a base modulation order associated with a base layer and an enhancement modulation order associated with an enhancement layer. The distribution of power in the extended constellation may be uniform as discussed with reference to FIG. 6. Base station 105-*b* may map a second portion of the second encoded bit stream to a second subset of the resource set that is exclusive of the first subset of the resource set in at least one dimension using an extended modulation order.

Base station 105-*b* may encode a first transport block including the first portion of the second encoded bit stream and a first subset of the second portion of the second encoded bit stream. Base station 105-*a* may also encode a second transport block including a second subset of the second portion of the encoded bit stream. Alternatively, base station 105-*b* may encode a single transport block including the first and second portions of the second encoded bit stream. In some cases, the transport block size may be based on the enhancement modulation order over the first subset of the resource set, the extended modulation order over the second subset of the resource set, and a coding rate associated with the enhancement layer. In other cases, the transport block size of the single transport block may be based on the enhancement modulation order over the resource set and a coding rate associated with the enhancement layer.

In some examples, base station 105-*b* may sequentially rate-match the second encoded bit stream to the resource set. In other examples, base station 105-*b* may sequentially rate-match the second encoded bit stream to bit positions corresponding to the enhancement modulation order in the first subset of the resource set and the second subset of the resource set and then to bit positions corresponding to the base modulation order in the second subset of the resource set. In yet other examples, base station 105-*a* may perform a first rate-matching procedure of the second encoded bit stream to bit positions corresponding to the enhancement modulation order in the first subset of the resource set and the second subset of the resource set, and base station 105-*a* may perform a second rate-matching procedure of the second encoded bit stream to bit positions corresponding to the base modulation order in the second subset of the resource set.

At step 820, base station 105-*b* may transmit the transmission to UE 115-*c* and another UE 115 (e.g., UE 115-*b*). The transmission may include an enhancement layer for UE 115-*c* and a base layer for the other UE 115. The base layer may span the first subset of the resource set and the enhancement layer may span the resource set. In some cases, the resource set may be larger in at least one dimension (e.g., time and/or frequency) than the first subset of the resource set. The base layer may be associated with the first data stream (i.e., the first encoded bit stream) and the enhancement layer may be associated with the second data stream (i.e., the second encoded bit stream). Moreover, the resource set may span a plurality of spatial layers, and at least one spatial layer of the plurality of spatial layers may include the base layer.

At block 825, UE 115-*c* may determine modulation orders associated with the transmission received at step 820. For example, UE 115-*c* may determine a base modulation order associated with the base layer and an enhancement modulation order associated with the enhancement layer. UE 115-*c* may also determine the extended modulation order based on the base modulation order and the enhancement modulation order. In some cases, UE 115-*c* may receive an indication of the enhancement modulation order from base station 105-*b* (e.g., in a DCI message), and UE 115-*c* may determine the extended modulation order by adding the base modulation order to the enhancement modulation order. In other cases, UE 115-*c* may receive an indication of the extended modulation order from base station 105-*b* (e.g., in a DCI message), and UE 115-*c* may determine the enhancement modulation order by subtracting the base modulation order from the extended modulation order.

At block 830, UE 115-*c* may de-map symbols of the combined constellation used for the transmission received at step 820 on the first subset of the resource set. After de-mapping symbols of the combined constellation, UE 115-*c* may obtain the first portion of the second data stream. At block 835, UE 115-*c* may de-map symbols of the extended constellation used for the transmission received at step 820 on the second subset of the resource set. After de-mapping symbols of the extended constellation, UE 115-*c* may obtain the second portion of the second data stream.

UE 115-*c* may decode a first transport block including the first portion of the second data stream and a first subset of the second portion of the second data stream. UE 115-*c* may also decode a second transport block including a second subset of the second portion of the second data stream. Alternatively, UE 115-*c* may decode a single transport block including the first and second portions of the second data stream. In some cases, the transport block size may be based on the enhancement modulation order over the first subset of the resource set, the extended modulation order over the second subset of the resource set, and a coding rate associated with the enhancement layer. In other cases, the transport block size of the single transport block may be based on the enhancement modulation order over the resource set and a coding rate associated with the enhancement layer.

In some examples, a plurality of bits of the single transport block may be sequentially rate-matched to the resource set. In other examples, the plurality of bits of the single transport block may be sequentially rate-matched to bit positions corresponding to the enhancement modulation order within the first subset of the resource set and the second subset of the resource set and then to bit positions corresponding to the base modulation order within the second subset of the resource set. In yet other examples, the plurality of bits of the single transport block may be rate-matched to bit positions corresponding to the enhancement modulation order within the first subset of the resource set and the second subset of the resource set according to a first rate-matching procedure, and the plurality of bits of the single transport block may be rate-matched to bit positions corresponding to the base modulation order within the second subset of the resource set according to a second rate-matching procedure.

Figure 9:
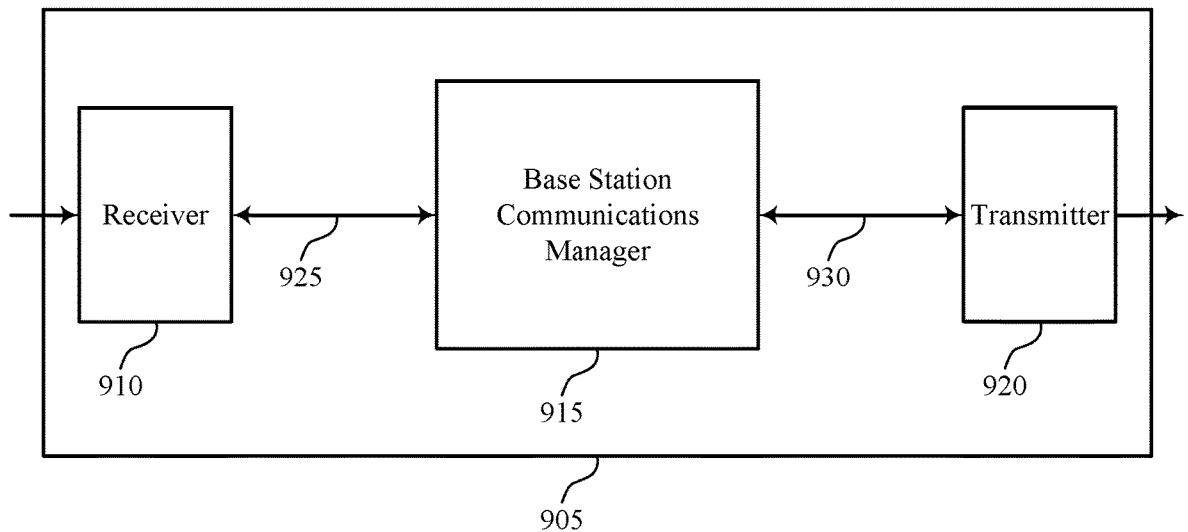
FIGS. 9 through 11 show block diagrams of a device that supports adaptive modulation order for MUSTs with non-aligned resources in accordance with various aspects of the present disclosure.

FIG. 9 shows a block diagram 900 of a wireless device 905 that supports adaptive modulation orders for MUSTs with non-aligned resources in accordance with various aspects of the present disclosure. Wireless device 905 may be an example of aspects of a base station 105 as described with reference to FIG. 1. Wireless device 905 may include receiver 910, base station communications manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to adaptive modulation orders for MUSTs with non-aligned resources, etc.). Information may be passed on to other components of the device, for example, via link 925. The receiver 910 may be an example of aspects of the transceiver 1235 described with reference to FIG. 12.

Base station communications manager 915 may be an example of aspects of the base station communications manager 1215 described with reference to FIG. 12. Base station communications manager 915 may schedule a transmission including a base layer for a first UE and an enhancement layer for a second UE, where the enhancement layer spans a resource set and the base layer spans a first subset of the resource set, map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order.

Transmitter 920 may transmit the transmission to the first UE and the second UE. Transmitter 920 may also transmit signals generated by other components of the device. In some cases, transmitter 920 may be in communication with base station communications manager 915 via link 930. In some examples, the transmitter 920 may be collocated with a receiver 910 in a transceiver module. For example, the transmitter 920 may be an example of aspects of the transceiver 1235 described with reference to FIG. 12. The transmitter 920 may include a single antenna, or it may include a set of antennas.

Figure 10:
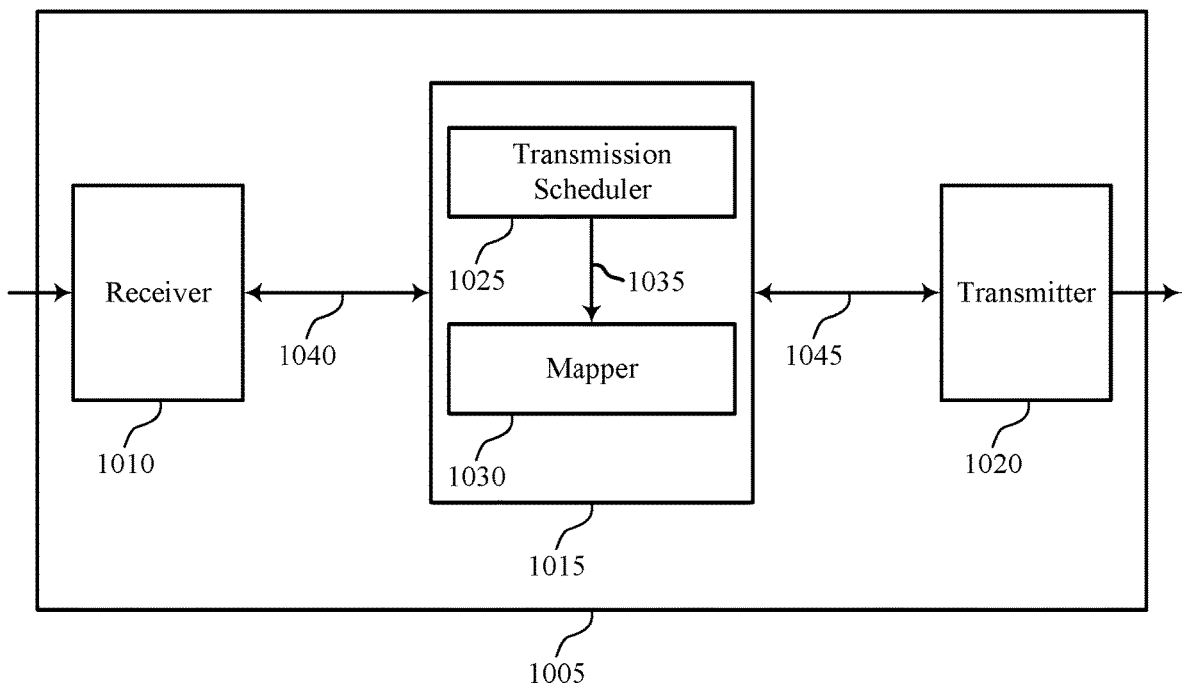

FIG. 10 shows a block diagram 1000 of a wireless device 1005 that supports adaptive modulation orders for MUSTs with non-aligned resources in accordance with various aspects of the present disclosure. Wireless device 1005 may be an example of aspects of a wireless device 905 or a base station 105 as described with reference to FIGS. 1 and 9. Wireless device 1005 may include receiver 1010, base station communications manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to adaptive modulation orders for MUSTs with non-aligned resources, etc.). Information may be passed on to other components of the device, for example, via link 1040. The receiver 1010 may be an example of aspects of the transceiver 1235 described with reference to FIG. 12.

Base station communications manager 1015 may be an example of aspects of the base station communications manager 1215 described with reference to FIG. 12. Base station communications manager 1015 may include transmission scheduler 1025 and mapper 1030.

Transmission scheduler 1025 may schedule a transmission including a base layer for a first UE and an enhancement layer for a second UE, where the enhancement layer spans a resource set and the base layer spans a first subset of the resource set. In some cases, the resource set includes a set of spatial layers, and at least one spatial layer of the set of spatial layers includes the base layer. In some cases, the base modulation order is a predetermined modulation order, and the predetermined modulation order corresponds to QPSK. In some cases, the enhancement modulation order corresponds to any of: QPSK, 16-QAM, or 64-QAM.

Mapper 1030 may receive information 1035 about the enhancement layer and the base layer and an indication of the resources allocated for the transmission from transmission scheduler 1025. Mapper 1030 may then map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order. In some cases, the at least one dimension includes a time dimension or a frequency dimension.

Mapper 1030 may also determine the extended modulation order based on adding the base modulation order to the enhancement modulation order, determine the enhancement modulation order based on subtracting the base modulation order from the extended modulation order, and determine the combined constellation based on a power ratio, the base modulation order, and the enhancement modulation order, where the combined constellation is a non-uniform constellation. In some cases, the mapping to the second subset of the resource set is performed using a uniform constellation corresponding to the extended modulation order.

Transmitter 1020 may transmit signals generated by other components of the device. In some cases, the transmitter 1020 may be in communication with base station communications manager 1015 via link 1045. In some examples, the transmitter 1020 may be collocated with a receiver 1010 in a transceiver module. For example, the transmitter 1020 may be an example of aspects of the transceiver 1235 described with reference to FIG. 12. The transmitter 1020 may include a single antenna, or it may include a set of antennas.

Figure 11:
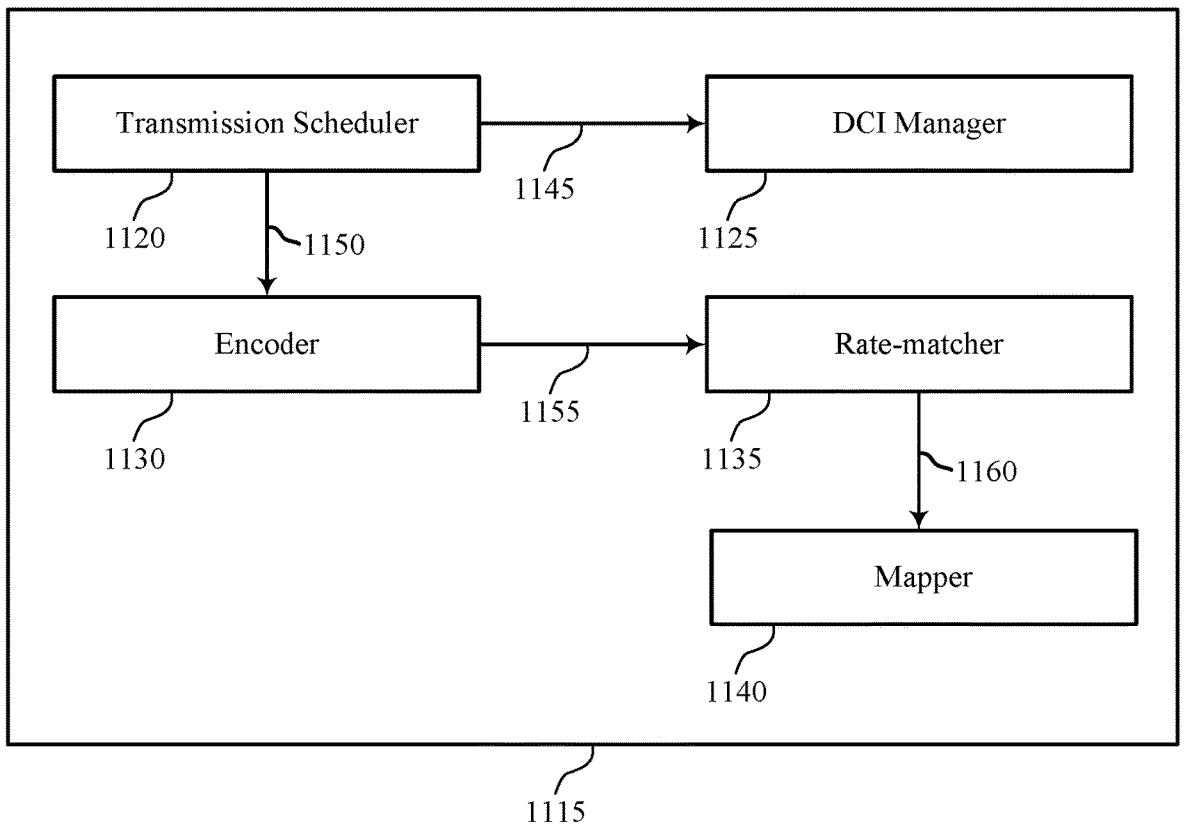

FIG. 11 shows a block diagram 1100 of a base station communications manager 1115 that supports adaptive modulation orders for MUSTs with non-aligned resources in accordance with various aspects of the present disclosure. The base station communications manager 1115 may be an example of aspects of a base station communications manager 915, a base station communications manager 1015, or a base station communications manager 1215 described with reference to FIGS. 9, 10, and 12. The base station communications manager 1115 may include transmission scheduler 1120, DCI manager 1125, encoder 1130, rate-matcher 1135, and mapper 1140. Each of these modules may communicate, directly or indirectly, with one another (e.g., via one or more buses).

Transmission scheduler 1120 may schedule a transmission including a base layer for a first UE and an enhancement layer for a second UE, where the enhancement layer spans a resource set and the base layer spans a first subset of the resource set. In some cases, the resource set includes a set of spatial layers, and at least one spatial layer of the set of spatial layers includes the base layer. In some cases, the base modulation order is a predetermined modulation order. In some cases, the predetermined modulation order corresponds to QPSK. In some cases, the enhancement modulation order corresponds to any of: QPSK, 16-QAM, or 64-QAM.

In some cases, DCI manager 1125 may receive information 1145 about a base modulation order associated with the base layer and an enhancement modulation order associated with the enhancement layer from transmission scheduler 1120. DCI manager 1125 may then transmit a DCI message that includes an indication of the enhancement modulation order, transmit a DCI message that includes an indication of an extended modulation order, and transmit a DCI message that includes an indication of a power ratio associated with the enhancement layer and the base layer for the first subset of the resource set.

Encoder may receive information 1150 about the layers of a scheduled transmission and resources allocated for the transmission from transmission scheduler 1120. Encoder 1130 may then encode bits for each of the layers of the scheduled transmission (e.g., the base layer and the enhancement layer). In some cases, encoder 1130 may encode a first transport block to obtain a first portion of a second encoded bit stream and a first subset of a second portion of a second encoded bit stream. In some cases, encoder 1130 may encode a second transport block to obtain a second subset of the second portion of the second encoded bit stream. In some cases, encoder 1130 may encode a single transport block to obtain first and second portions of the second encoded bit stream. Encoder 1130 may also determine a transport block size for the encoding based on the enhancement modulation order over the resource set and a coding rate associated with the enhancement layer, or determine a transport block size for the encoding based on the enhancement modulation order over the first subset of the resource set, the extended modulation order over the second subset of the resource set, and a coding rate associated with the enhancement layer.

Rate-matcher 1135 may receive encoded bits 1155 from encoder 1130. Rate-matcher 1135 may then rate-match the encoded bits based on the resources scheduled for the transmission. In some cases, rate-matcher 1135 may sequentially rate-match the second encoded bit stream to the resource set, or sequentially rate-match the second encoded bit stream to the first subset of the resource set and the second subset of the resource set corresponding to the enhancement modulation order and then to the second subset of the resource set corresponding to the base modulation order. In some cases, rate-matcher 1135 may perform a first rate-matching procedure of the second encoded bit stream to the first subset of the resource set and the second subset of the resource set corresponding to the enhancement modulation order, and perform a second rate-matching procedure of the second encoded bit stream to the second subset of the resource set corresponding to the base modulation order.

Mapper 1140 may receive the rate-matched bits 1160 from rate-matcher 1135. Mapper 1140 may then map the rate-matched bits to the resources allocated for the transmission. In some cases, mapper 1140 may map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order. In some cases, the at least one dimension includes a time dimension or a frequency dimension.

Mapper 1140 may also determine the extended modulation order based on adding the base modulation order to the enhancement modulation order, or determine the enhancement modulation order based on subtracting the base modulation order from the extended modulation order. In some cases, mapper 1140 may determine the combined constellation based on the power ratio, the base modulation order, and the enhancement modulation order, where the combined constellation is a non-uniform constellation. In some cases, the mapping to the second subset of the resource set is performed using a uniform constellation corresponding to the extended modulation order.

Figure 12:
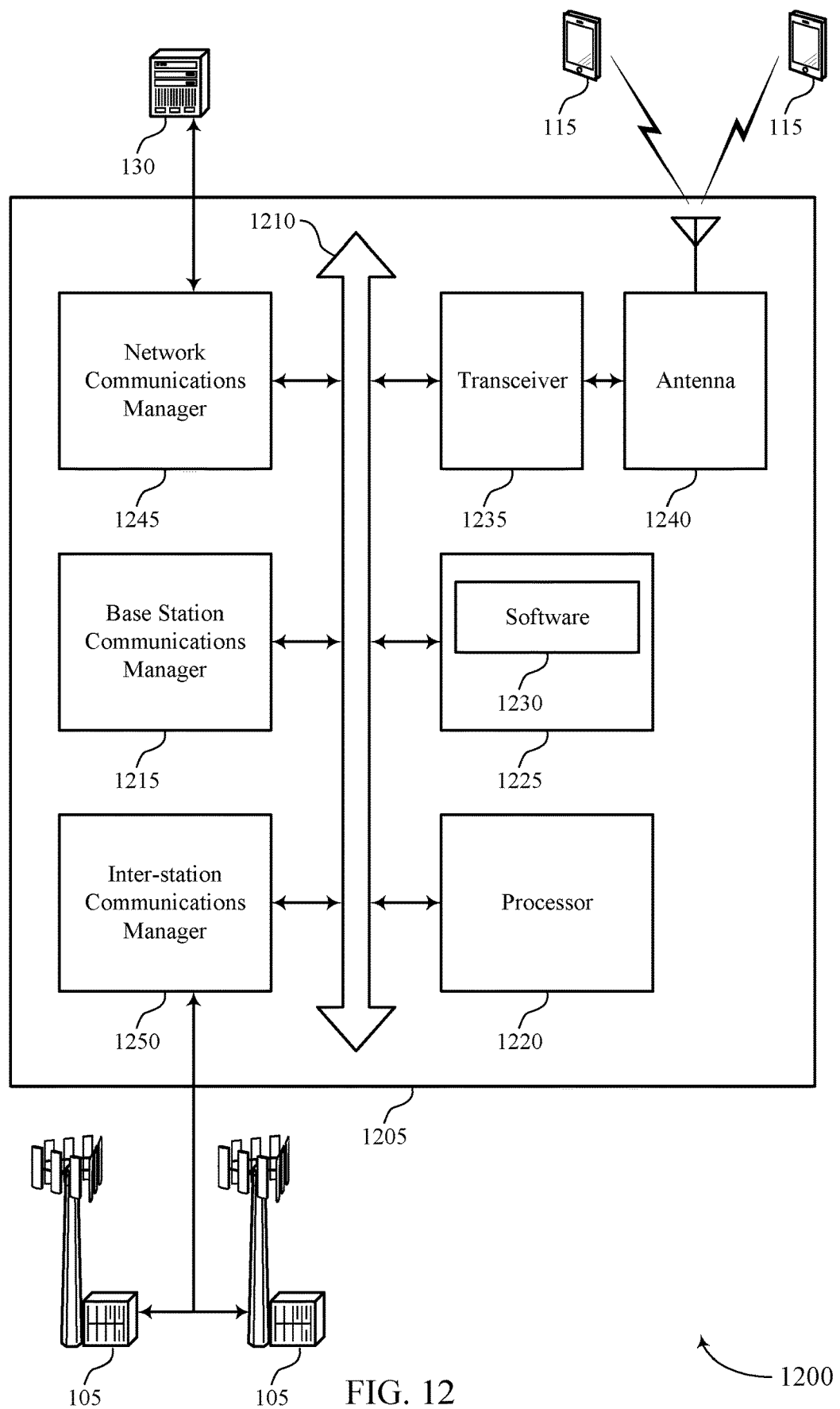
FIG. 12 illustrates a block diagram of a system including a base station that supports adaptive modulation order for MUSTs with non-aligned resources in accordance with various aspects of the present disclosure.

FIG. 12 shows a diagram of a system 1200 including a device 1205 that supports adaptive modulation orders for MUSTs with non-aligned resources in accordance with various aspects of the present disclosure. Device 1205 may be an example of or include the components of wireless device 905, wireless device 1005, or a base station 105 as described above, e.g., with reference to FIGS. 1, 9 and 10. Device 1205 may include components for bi-directional voice and data communications including components for transmitting and receiving communications, including base station communications manager 1215, processor 1220, memory 1225, software 1230, transceiver 1235, antenna 1240, network communications manager 1245, and inter-station communications manager 1250. These components may be in electronic communication via one or more busses (e.g., bus 1210). Device 1205 may communicate wirelessly with one or more UEs 115.

Base station communications manager 1215 may manage communications with other base stations 105, and may include a controller or scheduler for controlling communications with UEs 115 in cooperation with other base stations 105. For example, the base station communications manager 1215 may coordinate scheduling for transmissions to UEs 115 for various interference mitigation techniques such as beamforming or joint transmission. In some examples, base station communications manager 1215 may provide an X2 interface within an LTE/LTE-A wireless communication network technology to provide communication between base stations 105.

Processor 1220 may include an intelligent hardware device, (e.g., a general-purpose processor, a digital signal processor (DSP), a central processing unit (CPU), a microcontroller, an application-specific integrated circuit (ASIC), a field-programmable gate array (FPGA), a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting adaptive modulation orders for MUSTs with non-aligned resources).

Memory 1225 may include random access memory (RAM) and read only memory (ROM). The memory 1225 may store computer-readable, computer-executable software 1230 including instructions that, when executed, cause the processor to perform various functions described herein. In some cases, the memory 1225 may contain, among other things, a basic input/output system (BIOS) which may control basic hardware and/or software operation such as the interaction with peripheral components or devices.

Software 1230 may include code to implement aspects of the present disclosure, including code to support adaptive modulation orders for MUSTS with non-aligned resources. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

Network communications manager 1245 may manage communications with the core network (e.g., via one or more wired backhaul links). For example, the network communications manager 1245 may manage the transfer of data communications for client devices, such as one or more UEs 115.

Inter-station communications manager 1250 may manage communications with other base stations 105, and may include a controller or scheduler for controlling communications with UEs 115 in cooperation with other base stations 105. For example, the inter-station communications manager 1250 may coordinate scheduling for transmissions to UEs 115 for various interference mitigation techniques such as beamforming or joint transmission. In some examples, inter-station communications manager 1250 may provide an X2 interface within an LTE/LTE-A wireless communication network technology to provide communication between base stations 105.

Figure 13:
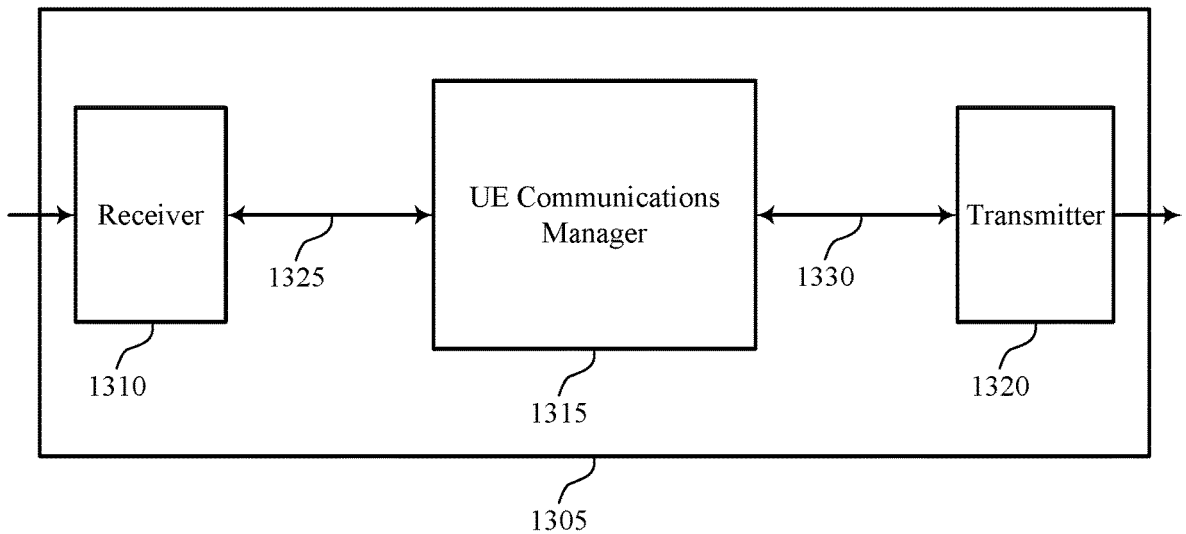
FIGS. 13 through 15 show block diagrams of a device that supports adaptive modulation order for MUSTs with non-aligned resources in accordance with various aspects of the present disclosure.

FIG. 13 shows a block diagram 1300 of a wireless device 1305 that supports adaptive modulation orders for MUSTs with non-aligned resources in accordance with various aspects of the present disclosure. Wireless device 1305 may be an example of aspects of a UE 115 as described with reference to FIG. 1. Wireless device 1305 may include receiver 1310, UE communications manager 1315, and transmitter 1320. Wireless device 1305 may also include a processor. Each of these components may be in communication with one another (e.g., via one or more buses).

Receiver 1310 may receive information such as packets, user data, or control information associated with various information channels (e.g., control channels, data channels, and information related to adaptive modulation orders for MUSTs with non-aligned resources, etc.). Information may be passed on to other components of the device, for example, via link 1325. The receiver 1310 may be an example of aspects of the transceiver 1635 described with reference to FIG. 16.

Receiver 1310 may also receive a transmission including a base layer associated with a first data stream and an enhancement layer associated with a second data stream, where the enhancement layer spans a resource set and the base layer spans a first subset of the resource set. In some cases, the resource set includes a set of spatial layers, and at least one spatial layer of the set of spatial layers includes the base layer. In some cases, the base modulation order is a predetermined modulation order. In some cases, the predetermined modulation order corresponds to QPSK. In some cases, the enhancement modulation order corresponds to any of: QPSK, 16-QAM, or 64-QAM.

UE communications manager 1315 may be an example of aspects of the UE communications manager 1615 described with reference to FIG. 16. UE communications manager 1315 may determine a base modulation order associated with the base layer and an enhancement modulation order associated with the enhancement layer, de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream. In some cases, the at least one dimension includes a time dimension or a frequency dimension.

Transmitter 1320 may transmit signals generated by other components of the device. In some cases, transmitter 1320 may be in communication with UE communications manager 1315 via link 1330. In some examples, the transmitter 1320 may be collocated with a receiver 1310 in a transceiver module. For example, the transmitter 1320 may be an example of aspects of the transceiver 1635 described with reference to FIG. 16. The transmitter 1320 may include a single antenna, or it may include a set of antennas.

Figure 14:
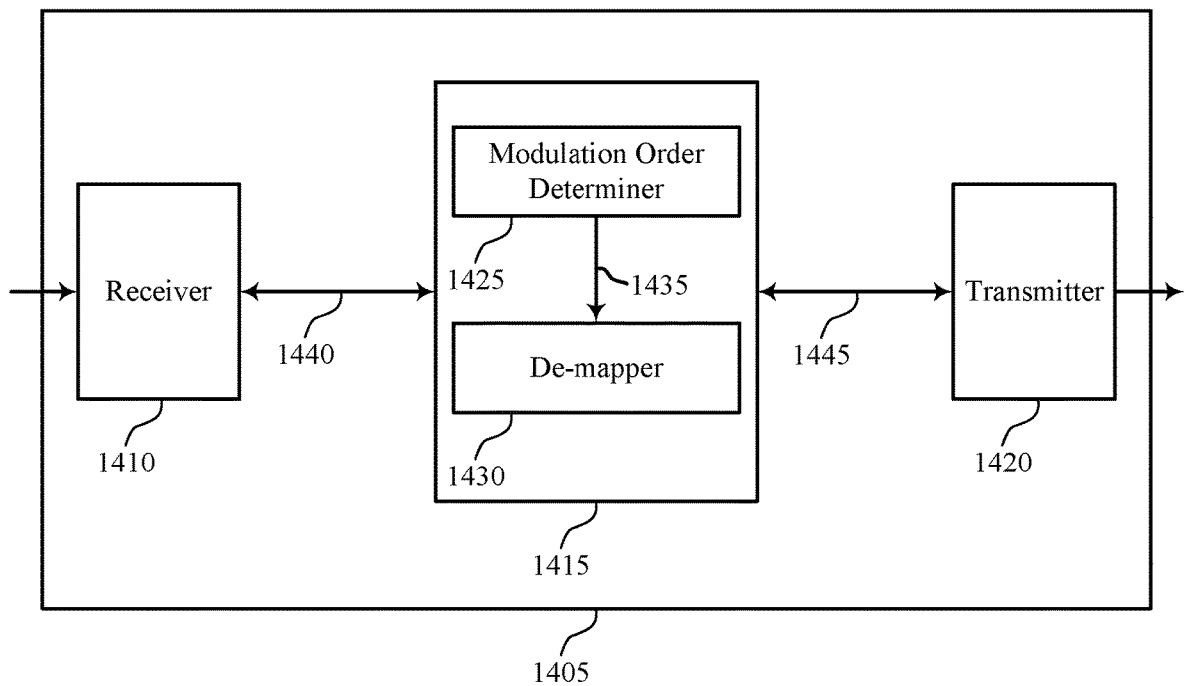

FIG. 14 shows a block diagram 1400 of a wireless device 1405 that supports adaptive modulation orders for MUSTs with non-aligned resources in accordance with various aspects of the present disclosure. Wireless device 1405 may be an example of aspects of a wireless device 1305 or a UE 115 as described with reference to FIGS. 1 and 13. Wireless device 1405 may include receiver 1410, UE communications manager 1415, and transmitter 1420. Wireless device 1405 may also include a processor. Each of these components may be in communication with one another (e.g., via one or more buses).

Receiver 1410 may receive information such as packets, user data, or control information associated with various information channels (e.g., control channels, data channels, and information related to adaptive modulation orders for MUSTs with non-aligned resources, etc.). Information may be passed on to other components of the device, for example, via link 1440. The receiver 1410 may be an example of aspects of the transceiver 1635 described with reference to FIG. 16.

UE communications manager 1415 may be an example of aspects of the UE communications manager 1615 described with reference to FIG. 16. UE communications manager 1415 may include modulation order determiner 1425 and de-mapper 1430. Modulation order determiner 1425 may determine a base modulation order associated with the base layer and an enhancement modulation order associated with the enhancement layer.

De-mapper 1430 may receive information 1435 about the base modulation order and the enhancement modulation order from modulation order determiner 1425. De-mapper 1430 may then de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

De-mapper 1430 may also determine the combined constellation based on the power ratio, the base modulation order, and the enhancement modulation order, where the combined constellation is a non-uniform constellation. In some cases, the extended modulation order is determined based on adding the base modulation order to the enhancement modulation order. In some cases, the enhancement modulation order is determined based on subtracting the base modulation order from the extended modulation order. In some cases, the de-mapping symbols of the extended set of resources is performed using a uniform constellation corresponding to the extended modulation order.

Transmitter 1420 may transmit signals generated by other components of the device. In some cases, transmitter 1420 may be in communication with UE communications manager 1415 via link 1445. In some examples, the transmitter 1420 may be collocated with a receiver 1410 in a transceiver module. For example, the transmitter 1420 may be an example of aspects of the transceiver 1635 described with reference to FIG. 16. The transmitter 1420 may include a single antenna, or it may include a set of antennas.

Figure 15:
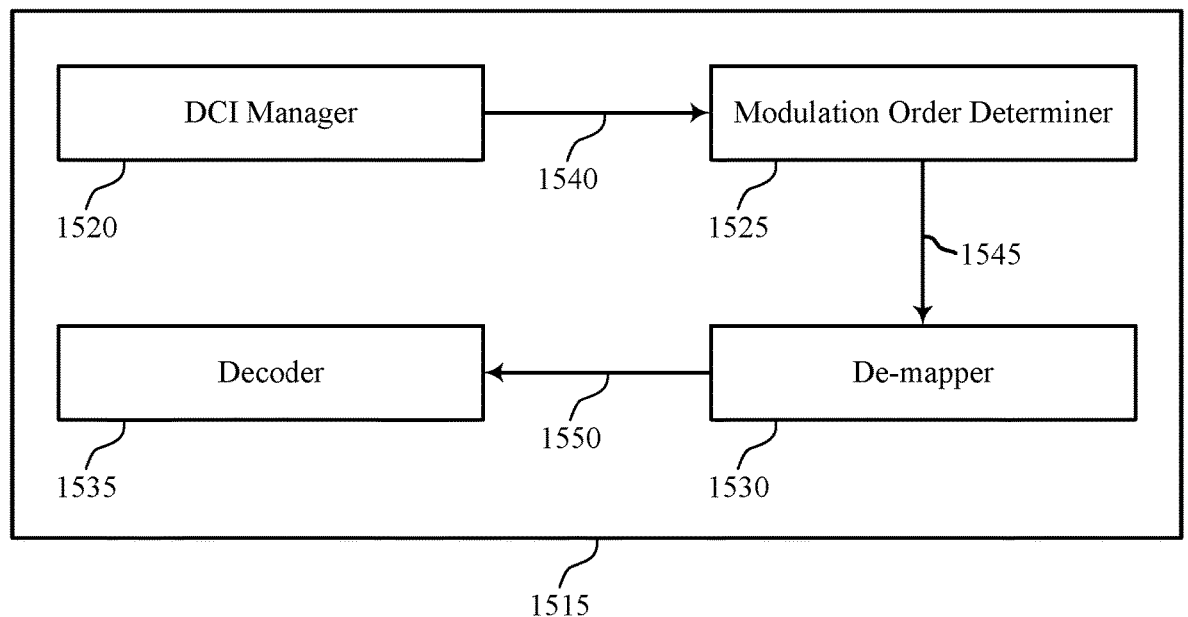

FIG. 15 shows a block diagram 1500 of a UE communications manager 1515 that supports adaptive modulation orders for MUSTs with non-aligned resources in accordance with various aspects of the present disclosure. The UE communications manager 1515 may be an example of aspects of a UE communications manager described with reference to FIGS. 13, 14, and 16. The UE communications manager 1515 may include DCI manager 1520, modulation order determiner 1525, de-mapper 1530, and decoder 1535. Each of these modules may communicate, directly or indirectly, with one another (e.g., via one or more buses).

DCI manager 1520 may receive a DCI message that includes an indication of the enhancement modulation order, receive a DCI message that includes an indication of the extended modulation order, and/or receive a DCI message that includes an indication of a power ratio associated with the enhancement layer and the base layer for the first subset of the resource set. In some cases, DCI manager may transmit information 1540 (e.g., received in a DCI message) about the enhancement modulation order, extended modulation order, and/or the power ratio to modulation order determiner 1525. Modulation order determiner 1525 may determine a base modulation order associated with the base layer and an enhancement modulation order associated with the enhancement layer. In some cases, modulation order determiner may transmit an indication 1545 of the base modulation order associated with the base layer and the enhancement modulation order associated with the enhancement layer to de-mapper 1530.

De-mapper 1530 may receive this information and may de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream.

De-mapper 1530 may determine the combined constellation based on the power ratio, the base modulation order, and the enhancement modulation order, where the combined constellation is a non-uniform constellation. In some cases, the extended modulation order is determined based on adding the base modulation order to the enhancement modulation order. In some cases, the enhancement modulation order is determined based on subtracting the base modulation order from the extended modulation order. In some cases, the de-mapping symbols of the second subset of the resource set is performed using a uniform constellation corresponding to the extended modulation order.

Decoder 1535 may receive the de-mapped symbols 1550 from de-mapper 1530, and decoder 1535 may decode a first transport block including the first set of de-mapped symbols and a first subset of the second set of de-mapped symbols corresponding to the enhancement modulation order. In some cases, decoder 1535 may decode a second transport block including a second subset of the second set of de-mapped symbols corresponding to the base modulation order. In some cases, decoder 1535 may decode a single transport block including the first set of de-mapped symbols and the second set of de-mapped symbols. Decoder 1535 may also determine a transport block size for the decoding based on the enhancement modulation order over the resource set and a coding rate associated with the enhancement layer, or determine a transport block size for the decoding based on the enhancement modulation order over the first subset of the resource set, the extended modulation order over the second subset of the resource set, and a coding rate associated with the enhancement layer.

In some cases, a set of bits of the single transport block are sequentially rate-matched to the resource set. In some cases, a set of bits of the single transport block are sequentially rate-matched to bit positions corresponding to the enhancement modulation order within the first subset of the resource set and the second subset of the resource set and then to bit positions corresponding to the base modulation order within the second subset of the resource set. In some cases, a set of bits of the single transport block are rate-matched to bit positions corresponding to the enhancement modulation order within the first subset of the resource set and the second subset of the resource set according to a first rate-matching procedure, and the set of bits of the single transport block are rate-matched to bit positions corresponding to the base modulation order within the second subset of the resource set according to a second rate-matching procedure.

Figure 16:
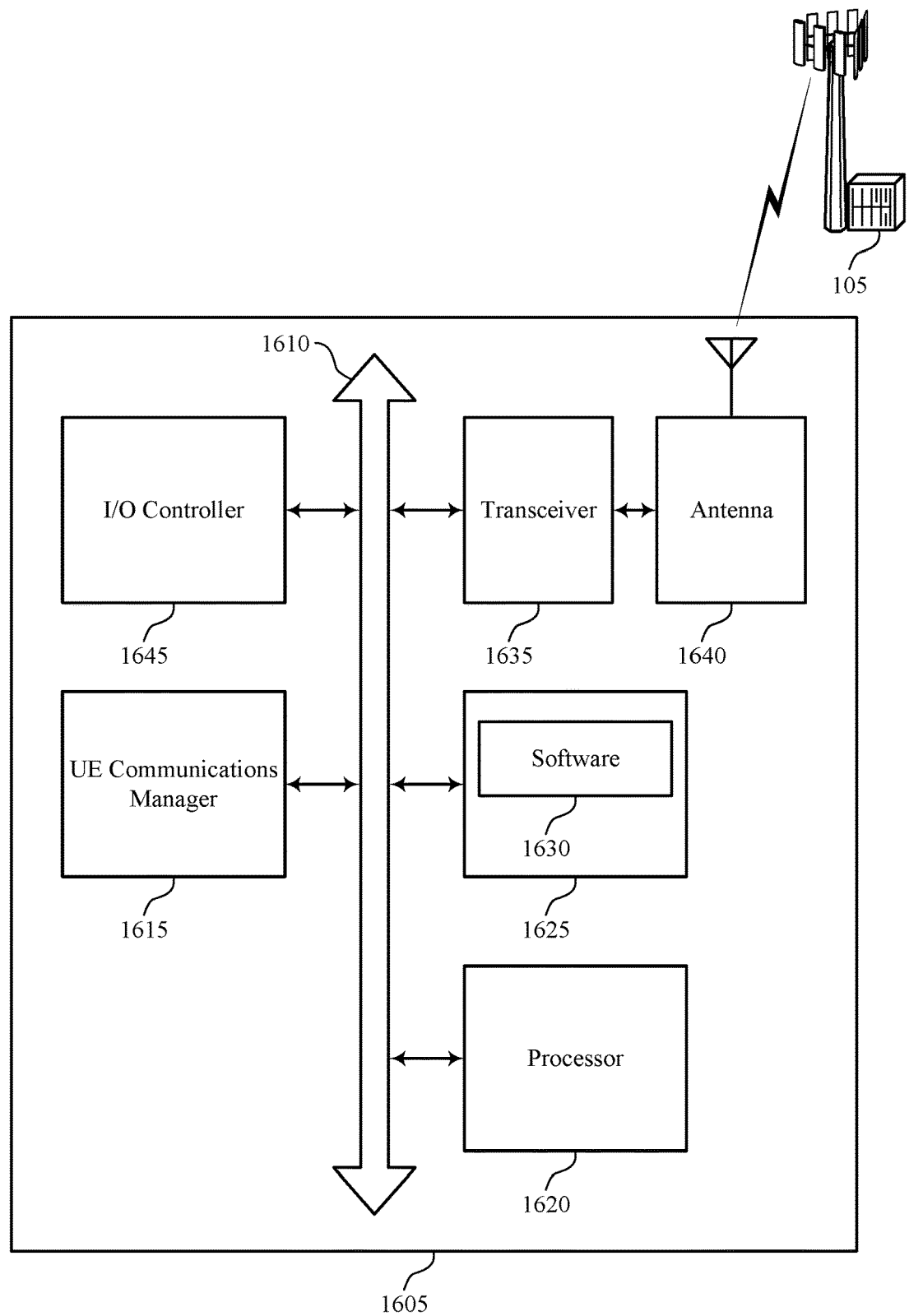
FIG. 16 illustrates a block diagram of a system including a user equipment (UE) that supports adaptive modulation order for MUSTs with non-aligned resources in accordance with various aspects of the present disclosure.

FIG. 16 shows a diagram of a system 1600 including a device 1605 that supports adaptive modulation orders for MUSTs with non-aligned resources in accordance with various aspects of the present disclosure. Device 1605 may be an example of or include the components of UE 115 as described above, e.g., with reference to FIG. 1. Device 1605 may include components for bi-directional voice and data communications including components for transmitting and receiving communications, including UE communications manager 1615, processor 1620, memory 1625, software 1630, transceiver 1635, antenna 1640, and I/O controller 1645. These components may be in electronic communication via one or more busses (e.g., bus 1610). Device 1605 may communicate wirelessly with one or more base stations 105.

Processor 1620 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1620 may be configured to operate a memory array using a memory controller. In other cases, a memory controller may be integrated into processor 1620. Processor 1620 may be configured to execute computer-readable instructions stored in a memory to perform various functions (e.g., functions or tasks supporting adaptive modulation orders for MUSTs with non-aligned resources).

Memory 1625 may include RAM and ROM. The memory 1625 may store computer-readable, computer-executable software 1630 including instructions that, when executed, cause the processor to perform various functions described herein. In some cases, the memory 1625 may contain, among other things, a BIOS which may control basic hardware and/or software operation such as the interaction with peripheral components or devices.

Software 1630 may include code to implement aspects of the present disclosure, including code to support adaptive modulation orders for MUSTs with non-aligned resources. Software 1630 may be stored in a non-transitory computer-readable medium such as system memory or other memory. In some cases, the software 1630 may not be directly executable by the processor but may cause a computer (e.g., when compiled and executed) to perform functions described herein.

Transceiver 1635 may communicate bi-directionally, via one or more antennas, wired, or wireless links as described above. For example, the transceiver 1635 may represent a wireless transceiver and may communicate bi-directionally with another wireless transceiver. The transceiver 1635 may also include a modem to modulate the packets and provide the modulated packets to the antennas for transmission, and to demodulate packets received from the antennas.

In some cases, the wireless device may include a single antenna 1640. However, in some cases the device may have more than one antenna 1640, which may be capable of concurrently transmitting or receiving multiple wireless transmissions.

I/O controller 1645 may manage input and output signals for device 1605. I/O controller 1645 may also manage peripherals not integrated into device 1605. In some cases, I/O controller 1645 may represent a physical connection or port to an external peripheral. In some cases, I/O controller 1645 may utilize an operating system such as iOS®, ANDROID®, MS-DOS®, MS-WINDOWS®, OS/2®, UNIX®, LINUX®, or another known operating system.

Figure 17:
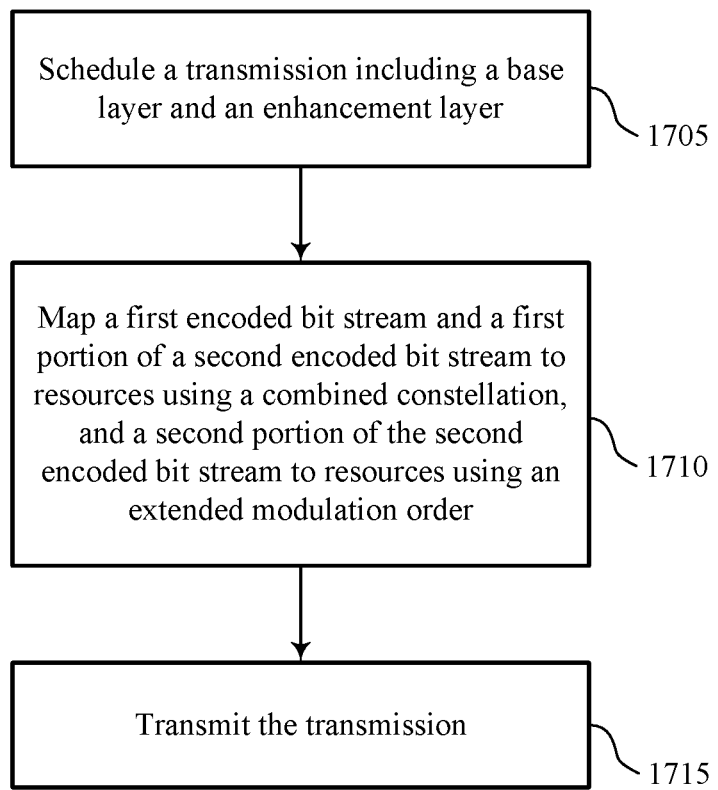
FIGS. 17 through 18 illustrate methods for adaptive modulation order for MUSTs with non-aligned resources in accordance with various aspects of the present disclosure.

FIG. 17 shows a flowchart illustrating a method 1700 that supports adaptive modulation orders for MUSTs with non-aligned resources in accordance with various aspects of the present disclosure. The operations of method 1700 may be implemented by a base station 105 or its components as described herein. For example, the operations of method 1700 may be performed by a base station communications manager as described with reference to FIGS. 9 through 12. In some examples, a base station 105 may execute a set of codes to control the functional elements of the device to perform the functions described below. Additionally or alternatively, the base station 105 may perform aspects of the functions described below using special-purpose hardware.

At block 1705, the base station 105 may schedule a transmission comprising a base layer for a first UE and an enhancement layer for a second UE, wherein the enhancement layer spans a resource set and the base layer spans a first subset of the resource set. The operations of block 1705 may be performed according to the methods described with reference to FIGS. 1 through 8. In certain examples, aspects of the operations of block 1705 may be performed by a transmission scheduler as described with reference to FIGS. 9 through 12.

At block 1710, the base station 105 may map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended modulation order. The operations of block 1710 may be performed according to the methods described with reference to FIGS. 1 through 8. In certain examples, aspects of the operations of block 1710 may be performed by a mapper as described with reference to FIGS. 9 through 12.

At block 1715, the base station 105 may transmit the transmission to the first UE and the second UE. The operations of block 1715 may be performed according to the methods described with reference to FIGS. 1 through 8. In certain examples, aspects of the operations of block 1715 may be performed by a transmitter as described with reference to FIGS. 9 through 12.

Figure 18:
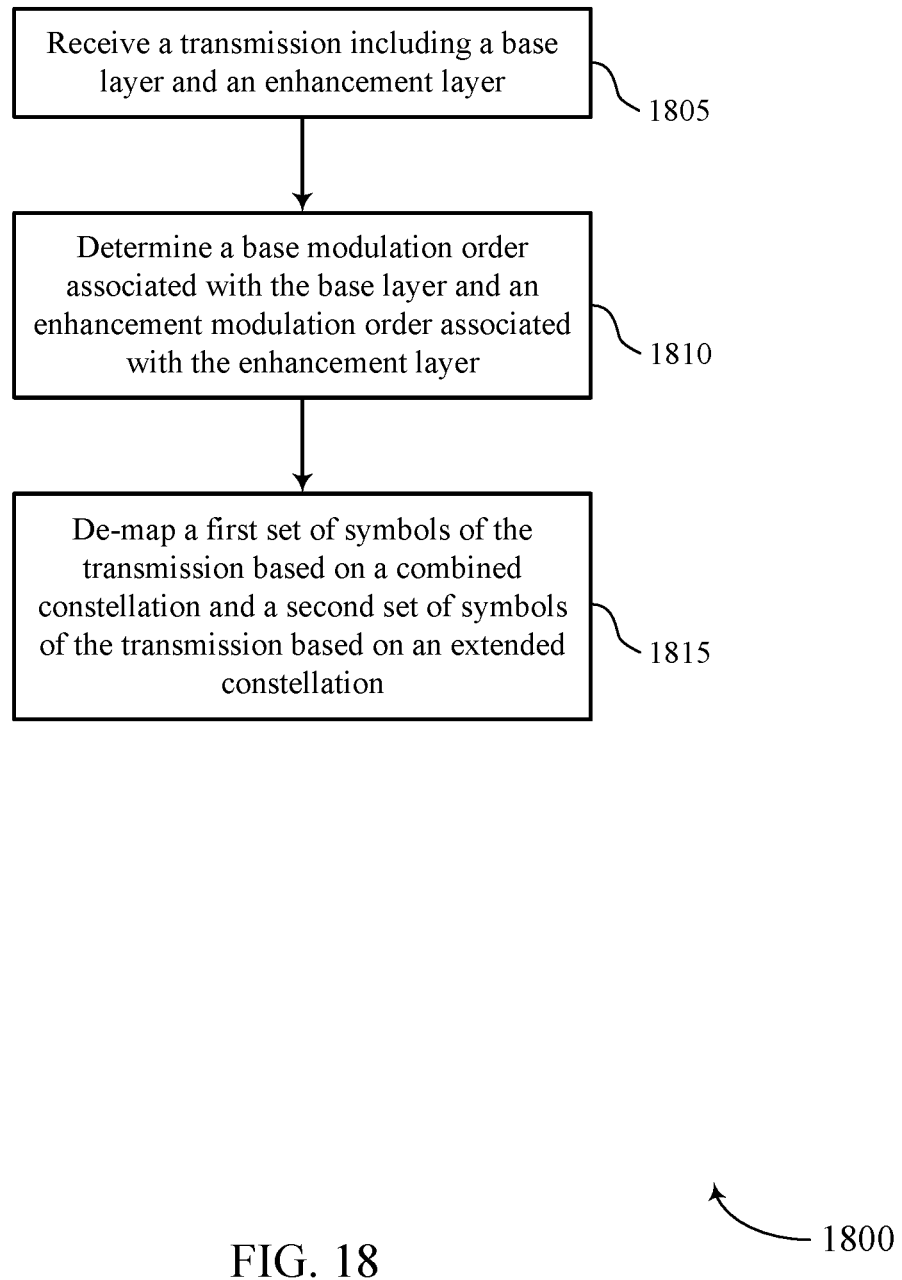

FIG. 18 shows a flowchart illustrating a method 1800 that supports adaptive modulation orders for MUSTS with non-aligned resources in accordance with various aspects of the present disclosure. The operations of method 1800 may be implemented by a UE 115 or its components as described herein. For example, the operations of method 1800 may be performed by a UE communications manager as described with reference to FIGS. 13 through 16. In some examples, a UE 115 may execute a set of codes to control the functional elements of the device to perform the functions described below. Additionally or alternatively, the UE 115 may perform aspects of the functions described below using special-purpose hardware.

At block 1805, the UE 115 may receive a transmission comprising a base layer associated with a first data stream and an enhancement layer associated with a second data stream, wherein the enhancement layer spans a resource set and the base layer spans a first subset of the resource set. The operations of block 1805 may be performed according to the methods described with reference to FIGS. 1 through 8. In certain examples, aspects of the operations of block 1805 may be performed by a receiver as described with reference to FIGS. 13 through 16.

At block 1810, the UE 115 may determine a base modulation order associated with the base layer and an enhancement modulation order associated with the enhancement layer. The operations of block 1810 may be performed according to the methods described with reference to FIGS. 1 through 8. In certain examples, aspects of the operations of block 1810 may be performed by a modulation order determiner as described with reference to FIGS. 13 through 16.

At block 1815, the UE 115 may de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended modulation order to obtain a second set of de-mapped symbols associated with the second data stream. The operations of block 1815 may be performed according to the methods described with reference to FIGS. 1 through 8. In certain examples, aspects of the operations of block 1815 may be performed by a de-mapper as described with reference to FIGS. 13 through 16.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE system may be described for purposes of example, and LTE terminology may be used in much of the description, the techniques described herein are applicable beyond LTE applications.

In LTE/LTE-A networks, including such networks described herein, the term evolved node B (eNB) may be generally used to describe the base stations. The wireless communications system or systems described herein may include a heterogeneous LTE/LTE-A network in which different types of evolved node B (eNBs) provide coverage for various geographical regions. For example, each eNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   scheduling a transmission comprising a base layer for a first user equipment (UE) and an enhancement layer for a second UE, wherein the enhancement layer spans a resource set and the base layer spans a first subset of the resource set;
   mapping a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended constellation of an extended modulation order, wherein the extended constellation is different from the combined constellation; and
   transmitting the transmission to the first UE and the second UE.

2. The method of claim 1, further comprising:
   encoding a first transport block to obtain the first portion of the second encoded bit stream and a first subset of the second portion of the second encoded bit stream; and
   encoding a second transport block to obtain a second subset of the second portion of the second encoded bit stream.

3. The method of claim 1, further comprising:
   encoding a single transport block to obtain the first and second portions of the second encoded bit stream.

4. The method of claim 3, further comprising:
   determining a transport block size for the encoding based on the enhancement modulation order over the resource set and a coding rate associated with the enhancement layer.

5. The method of claim 4, further comprising:
   sequentially rate-matching the second encoded bit stream to the resource set.

6. The method of claim 4, further comprising:
   sequentially rate-matching, in a single rate-matching procedure, the second encoded bit stream to bit positions corresponding to the enhancement modulation order in the first subset of the resource set and the second subset of the resource set and then to bit positions corresponding to the base modulation order in the second subset of the resource set.

7. The method of claim 4, further comprising:
   performing a first rate-matching procedure of the second encoded bit stream to bit positions corresponding to the enhancement modulation order in the first subset of the resource set and the second subset of the resource set; and
   performing a second rate-matching procedure of the second encoded bit stream to bit positions corresponding to the base modulation order in the second subset of the resource set.

8. The method of claim 3, further comprising:
   determining a transport block size for the encoding based on the enhancement modulation order over the first subset of the resource set, the extended modulation order over the second subset of the resource set, and a coding rate associated with the enhancement layer.

9. The method of claim 1, further comprising:
   transmitting a downlink control information (DCI) message that comprises an indication of the enhancement modulation order or the extended modulation order.

10. The method of claim 9, further comprising:
determining the extended modulation order based on adding the base modulation order to the enhancement modulation order.

11. The method of claim 9, further comprising:
determining the enhancement modulation order based on subtracting the base modulation order from the extended modulation order.

12. The method of claim 1, wherein the resource set comprises a plurality of spatial layers, and wherein at least one spatial layer of the plurality of spatial layers comprises the base layer.

13. The method of claim 1, wherein the at least one dimension comprises a time dimension or a frequency dimension.

14. The method of claim 1, further comprising:
transmitting a downlink control information (DCI) message that comprises an indication of a power ratio associated with the enhancement layer and the base layer for the first subset of the resource set; and
determining the combined constellation based on the power ratio, the base modulation order, and the enhancement modulation order, wherein the combined constellation is a non-uniform constellation.

15. The method of claim 1, wherein the mapping to the second subset of the resource set is performed using a uniform constellation corresponding to the extended modulation order.

16. The method of claim 1, wherein the base modulation order corresponds to quadrature phase shift keying (QPSK).

17. The method of claim 1, wherein the enhancement modulation order corresponds to any of: quadrature phase shift keying (QPSK), 16-quadrature amplitude modulation (QAM), or 64-QAM.

18. A method for wireless communication, comprising:
receiving a transmission comprising a base layer associated with a first data stream and an enhancement layer associated with a second data stream, wherein the enhancement layer spans a resource set and the base layer spans a first subset of the resource set;
determining a base modulation order associated with the base layer and an enhancement modulation order associated with the enhancement layer; and
de-mapping symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended constellation of an extended modulation order to obtain a second set of de-mapped symbols associated with the second data stream, wherein the extended constellation is different from the combined constellation.

19. The method of claim 18, further comprising:
decoding a first transport block comprising the first set of de-mapped symbols and a first subset of the second set of de-mapped symbols corresponding to the enhancement modulation order; and
decoding a second transport block comprising a second subset of the second set of de-mapped symbols corresponding to the base modulation order.

20. The method of claim 18, further comprising:
decoding a single transport block comprising the first set of de-mapped symbols and the second set of de-mapped symbols.

21. The method of claim 20, further comprising:
determining a transport block size for the decoding based on the enhancement modulation order over the resource set and a coding rate associated with the enhancement layer.

22. The method of claim 21, wherein a plurality of bits of the single transport block are sequentially rate-matched to the resource set, or wherein the plurality of bits of the single transport block are sequentially rate-matched, in a single rate-matching procedure, to bit positions corresponding to the enhancement modulation order within the first subset of the resource set and the second subset of the resource set and then to bit positions corresponding to the base modulation order within the second subset of the resource set.

23. The method of claim 21, wherein a plurality of bits of the single transport block are rate-matched to bit positions corresponding to the enhancement modulation order within the first subset of the resource set and the second subset of the resource set according to a first rate-matching procedure, and the plurality of bits of the single transport block are rate-matched to bit positions corresponding to the base modulation order within the second subset of the resource set according to a second rate-matching procedure.

24. The method of claim 20, further comprising:
determining a transport block size for the decoding based on the enhancement modulation order over the first subset of the resource set, the extended modulation order over the second subset of the resource set, and a coding rate associated with the enhancement layer.

25. The method of claim 18, wherein the resource set comprises a plurality of spatial layers, and wherein at least one spatial layer of the plurality of spatial layers comprises the base layer.

26. The method of claim 18, wherein the at least one dimension comprises a time dimension or a frequency dimension.

27. The method of claim 18, further comprising:
receiving a downlink control information (DCI) message that comprises an indication of a power ratio associated with the enhancement layer and the base layer for the first subset of the resource set; and
determining the combined constellation based on the power ratio, the base modulation order, and the enhancement modulation order, wherein the combined constellation is a non-uniform constellation.

28. The method of claim 18, wherein the de-mapping symbols of the second subset of the resource set is performed using a uniform constellation corresponding to the extended modulation order.

29. An apparatus for wireless communication, in a system comprising:
a processor;
memory in electronic communication with the processor; and
instructions stored in the memory and operable, when executed by the processor, to cause the apparatus to:
schedule a transmission comprising a base layer for a first user equipment (UE) and an enhancement layer for a second UE, wherein the enhancement layer spans a resource set and the base layer spans a first subset of the resource set;
map a first encoded bit stream for the first UE and a first portion of a second encoded bit stream for the second UE to the first subset of the resource set using a combined constellation of a base modulation order associated with the base layer and an enhancement modulation order associated with the enhancement layer, and a second portion of the second encoded bit stream to a second subset of the resource set that is exclusive of the first subset of the resource set in at least one dimension using an extended constellation of an extended modulation order, wherein the extended constellation is different from the combined constellation; and transmit the transmission to the first UE and the second UE.

30. An apparatus for wireless communication, in a system comprising:

a processor;

memory in electronic communication with the processor; and instructions stored in the memory and operable, when executed by the processor, to cause the apparatus to:

receive a transmission comprising a base layer associated with a first data stream and an enhancement layer associated with a second data stream, wherein the enhancement layer spans a resource set and the base layer spans a first subset of the resource set;

determine a base modulation order associated with the base layer and an enhancement modulation order associated with the enhancement layer; and de-map symbols of the first subset of the resource set based on a combined constellation of the base modulation order and the enhancement modulation order to obtain a first set of de-mapped symbols associated with the second data stream, and symbols of a second subset of the resource set that is exclusive of the first subset of the resource set in at least one dimension based on an extended constellation of an extended modulation order to obtain a second set of de-mapped symbols associated with the second data stream, wherein the extended constellation is different from the combined constellation.

* * * * *